(12) United States Patent
Honma et al.

(10) Patent No.: US 10,450,389 B2
(45) Date of Patent: Oct. 22, 2019

(54) CURABLE COMPOSITION FOR PHOTOIMPRINT AND METHOD OF PRODUCING FILM, OPTICAL COMPONENT, CIRCUIT BOARD, OR ELECTRONIC COMPONENT USING THE COMPOSITION

(71) Applicant: CANON KABUSHIKI KAISHA, Tokyo (JP)

(72) Inventors: Takeshi Honma, Tokyo (JP); Toshiki Ito, Kawasaki (JP); Jun Kato, Yokohama (JP); Shiori Yonezawa, Tokyo (JP); Youji Kawasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 101 days.

(21) Appl. No.: 14/914,607

(22) PCT Filed: Aug. 22, 2014

(86) PCT No.: PCT/JP2014/072666
§ 371 (c)(1),
(2) Date: Feb. 25, 2016

(87) PCT Pub. No.: WO2015/030151
PCT Pub. Date: Mar. 5, 2015

(65) Prior Publication Data
US 2016/0215074 A1 Jul. 28, 2016

(30) Foreign Application Priority Data

Aug. 30, 2013 (JP) ................................ 2013-179270
Feb. 26, 2014 (JP) ................................ 2014-035846
Jul. 25, 2014 (JP) ................................ 2014-151500

(51) Int. Cl.
| | |
|---|---|
| *C08F 2/50* | (2006.01) |
| *C09D 4/00* | (2006.01) |
| *G03F 7/00* | (2006.01) |
| *G02B 1/12* | (2006.01) |
| *G03F 7/031* | (2006.01) |
| *H01L 21/311* | (2006.01) |
| *H01L 21/3115* | (2006.01) |

(52) U.S. Cl.
CPC ............... *C08F 2/50* (2013.01); *C09D 4/00* (2013.01); *G02B 1/12* (2013.01); *G03F 7/0002* (2013.01); *G03F 7/031* (2013.01); *H01L 21/31144* (2013.01); *H01L 21/31155* (2013.01)

(58) Field of Classification Search
CPC ................ C08F 2/50; C08F 2220/1875; C08F 2220/185; C08F 2222/1013; C08F 2222/102; C09D 4/00; G03F 7/0002; G03F 7/031; G02B 1/12; H01L 21/311144; H01L 21/31155
See application file for complete search history.

(56) References Cited

U.S. PATENT DOCUMENTS

| | | | | |
|---|---|---|---|---|
| 2010/0009137 | A1 | 1/2010 | Kodama | |
| 2011/0183127 | A1 | 7/2011 | Kodama | |
| 2014/0154471 | A1* | 6/2014 | Kodama | ................... C08F 2/46 428/156 |

FOREIGN PATENT DOCUMENTS

| | | |
|---|---|---|
| CN | 101384959 A | 3/2009 |
| CN | 101535381 A | 9/2009 |
| CN | 102234460 A | 11/2011 |
| CN | 102459476 A | 5/2012 |
| EP | 3000121 A1 | 3/2016 |
| JP | 2010-506966 A | 3/2010 |
| JP | 2010506966 A | 3/2010 |
| JP | 2010-073811 A | 4/2010 |
| JP | 2010-114209 A | 5/2010 |
| JP | 2010114209 A | 5/2010 |
| JP | 2010-206115 A | 9/2010 |
| JP | 2010206115 A | 9/2010 |
| JP | 2012-164785 A | 8/2012 |
| JP | 2012164785 A | 8/2012 |
| JP | 2014-196284 A | 10/2014 |
| JP | 2015179807 A | 10/2015 |
| KR | 10-2009-0031274 A | 3/2009 |
| WO | 2013/118791 A1 | 8/2013 |
| WO | 2013/183467 A1 | 12/2013 |

* cited by examiner

*Primary Examiner* — Sanza L. McClendon
(74) *Attorney, Agent, or Firm* — Canon U.S.A., Inc. IP Division

(57) ABSTRACT

A curable composition for photoimprint at least includes a polymerizable compound component (A) and a photopolymerization initiator component (B) and satisfies expression (1) and (2):

$$0.800 \leq Er_{10}/Er_{200} \quad (1)$$

$$2.55 \leq Er_{10} \quad (2)$$

wherein, $Er_{10}$ represents the reduced modulus (GPa) of a photocured film prepared by exposing a film of the curable composition for photoimprint to light of 10 mJ/cm²; and $Er_{200}$ represents the reduced modulus (GPa) of a photocured film prepared by exposing a film of the curable composition for photoimprint to light of 200 mJ/cm².

30 Claims, 1 Drawing Sheet

FIG. 1A STEP [1]
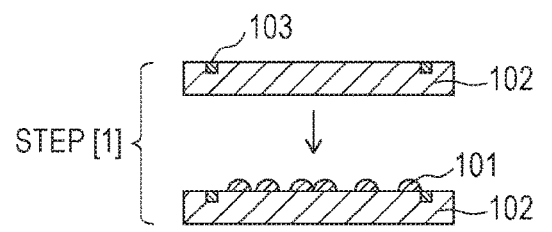
FIG. 1B STEP [2]
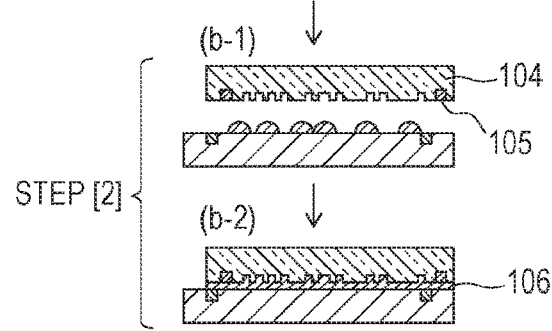
FIG. 1C STEP [3]
FIG. 1D STEP [4]
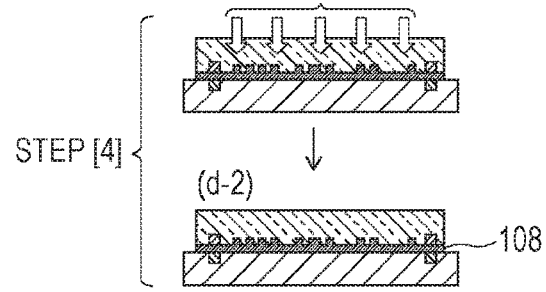
FIG. 1E STEP [5]
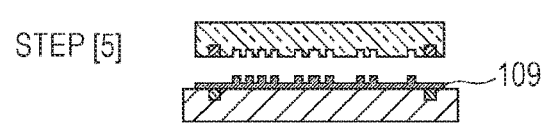
FIG. 1F STEP [6]
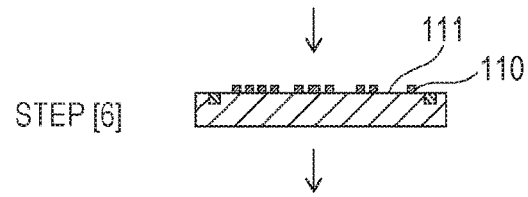
FIG. 1G STEP [7]

CURABLE COMPOSITION FOR PHOTOIMPRINT AND METHOD OF PRODUCING FILM, OPTICAL COMPONENT, CIRCUIT BOARD, OR ELECTRONIC COMPONENT USING THE COMPOSITION

TECHNICAL FIELD

The present invention relates to a curable composition for photoimprint and a method of producing a film, an optical component, a circuit board, or an electronic component using the composition.

BACKGROUND ART

With the increase in requirement for miniaturization of semiconductor devices, micro-electro-mechanical systems (MEMSs), and other devices, fine processing technology (also called photo-nanoimprint technology), in which a resist (curable composition for photoimprint) is molded with a mold on a substrate (wafer) to form a resist pattern on the substrate, has been attracting attentions, in addition to known photolithography technology.

In the photo-nanoimprint technology described in PTL 1, a resist is applied to a pattern-forming region on a substrate (arrangement step). Subsequently, the resist is molded using a mold provided with a pattern (mold contact step). The resist is cured by irradiation with light (light irradiation step) and is then detached (mold-releasing step) to form a resin pattern (photocured product) on the substrate. The whole process described above is repeated at another position on the substrate to form a fine structure on the entire substrate.

In some cases of producing, for example, a semiconductor device or MEMS, a substrate that has been already machined is further micromachined by photo-nanoimprint technology. In such a case, it is necessary to exactly adjust the position of the mold with respect to the pattern already formed on the substrate. This step is called alignment step and is performed between the mold contact step and the light irradiation step. Furthermore, in many cases of the photo-nanoimprint technology, a series of steps (shot) from the arrangement step to the mold-releasing step is performed plural times on one substrate.

CITATION LIST

Patent Literature

PTL 1 Japanese Patent Laid-Open No. 2010-073811

SUMMARY OF INVENTION

Technical Problem

In the light irradiation step, for example, the substrate absorbs the irradiated light and generates heat (exposure heat). The thermal distortion in the substrate caused by the exposure heat reaches also the area adjoining the region irradiated with light, leading to a problem of a low alignment precision of the shot in an adjacent region.

A reduction in the light exposure amount of irradiation, in order to improve the alignment precision by decreasing the exposure heat, causes insufficient curing of the curable composition for photoimprint, leading to a problem of occurrence of a defect, pattern collapse, in the mold-releasing step.

Solution to Problem

Accordingly, a first aspect of the present invention provides a curable composition for photoimprint at least including a polymerizable compound component (A) and a photopolymerization initiator component (B) and satisfying the following expression (1) and (2):

$$0.800 \leq Er_{10}/Er_{200} \tag{1}$$

$$2.55 \text{ GPa} \leq Er_{10} \tag{2}$$

wherein, $Er_{10}$ represents the reduced modulus (GPa) of a photocured film prepared by exposing a film of the curable composition for photoimprint to light of 10 mJ/cm$^2$; $Er_{200}$ represents the reduced modulus (GPa) of a photocured film prepared by exposing a film of the curable composition for photoimprint to light of 200 mJ/cm$^2$.

A second aspect of the present invention provides a curable composition for photoimprint at least including a polymerizable compound component (A) and a photopolymerization initiator component (B) and satisfying the following expression (5) and (6):

$$0.880 \leq E_{10}/E_{200} \tag{5}$$

$$4.00 \text{ GPa} \leq E_{10} \tag{6}$$

wherein, $E_{10}$ represents the Young's modulus (GPa) of a photocured film prepared by exposing a film of the curable composition for photoimprint to light of 10 mJ/cm$^2$; and $E_{200}$ represents the Young's modulus (GPa) of a photocured film prepared by exposing a film of the curable composition for photoimprint to light of 200 mJ/cm$^2$.

The present invention can provide a method of producing a film, optical component, circuit board, or electronic equipment by a photo-nanoimprint method while simultaneously achieving a high alignment precision and a low pattern collapse defect and can provide a curable composition for photoimprint for forming them.

Further features of the present invention will become apparent from the following description of exemplary embodiments with reference to the attached drawings.

BRIEF DESCRIPTION OF DRAWINGS

FIGS. 1A to 1G are schematic cross-sectional views illustrating an example of a method of producing a film of an embodiment of the present invention.

DESCRIPTION OF EMBODIMENTS

Embodiments of the present invention will now be described in detail with appropriate reference to the drawings. The present invention is not limited to the embodiments described below, and the embodiments can be appropriately modified or improved within a scope not departing from the gist of the present invention on the basis of knowledge of those skilled in the art. Such modifications and improvements are encompassed in the present invention.

Curable Composition for Photoimprint

The curable composition for photoimprint of this embodiment has two aspects.

A first aspect of the curable composition for photoimprint at least includes a polymerizable compound component (A)

and a photopolymerization initiator component (B) and satisfying the following expression (1) and (2):

$$0.800 \leq Er_{10}/Er_{200} \tag{1}$$

$$2.55 \text{ GPa} \leq Er_{10} \tag{2}$$

wherein, $Er_{10}$ represents the reduced modulus (GPa) of a photocured film prepared by exposing a film of the curable composition for photoimprint to light of 10 mJ/cm$^2$; $Er_{200}$ represents the reduced modulus (GPa) of a photocured film prepared by exposing a film of the curable composition for photoimprint to light of 200 mJ/cm$^2$.

A second aspect of curable composition for photoimprint at least includes a polymerizable compound component (A) and a photopolymerization initiator component (B) and satisfying the following expression (5) and (6):

$$0.880 \leq E_{10}/E_{200} \tag{5}$$

$$4.00 \text{ GPa} \leq E_{10} \tag{6}$$

wherein, $E_{10}$ represents the Young's modulus (GPa) of a photocured film prepared by exposing a film of the curable composition for photoimprint to light of 10 mJ/cm$^2$; and $E_{200}$ represents the Young's modulus (GPa) of a photocured film prepared by exposing a film of the curable composition for photoimprint to light of 200 mJ/cm$^2$.

A curable composition for photoimprint that can achieve both a high alignment precision and a low pattern collapse defect can be provided by satisfying at least one of the above-mentioned requirements.

In this embodiment and the present invention, the term "curable composition for photoimprint" refers to a composition for imprint that is polymerized and cured by irradiation with light.

Each component will now be described in detail.

Polymerizable Compound Component (A)

Component (A) is a polymerizable compound. In this embodiment and the present invention, the term "polymerizable compound" refers to a compound that reacts with a polymerizing factor (e.g., radical) generated from a photopolymerization initiator (component (B)) and forms a film of a polymer compound through a chain reaction (polymerization reaction).

Examples of the polymerizable compound include radical polymerizable compounds. The polymerizable compound component (A) may be composed of one polymerizable compound or may be composed of a plurality of polymerizable compounds.

In this embodiment and the present invention, "A is composed of B" means that A is B (that is, A consists of only B).

The radical polymerizable compound can be a compound having one or more acryloyl groups or methacryloyl groups, i.e., a (meth)acrylic compound.

Accordingly, the polymerizable compound preferably contains a (meth)acrylic compound, more preferably is mainly composed of a (meth)acrylic compound, and most preferably is a (meth)acrylic compound. Herein, the description of that the polymerizable compound is mainly composed of a (meth)acrylic compound refers to that 90% by weight or more of the polymerizable compound is a (meth)acrylic compound.

A radical polymerizable compound composed of a plurality of compounds each having one or more acryloyl or methacryloyl groups can contain a monofunctional acrylic monomer and a multifunctional acrylic monomer. A combination of a monofunctional acrylic monomer and a multifunctional acrylic monomer can provide a cured film having a high strength.

Examples of the monofunctional (meth)acrylic compound having one acryloyl or methacryloyl group include, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth) acrylate, 3-(2-phenylphenyl)-2-hydroxypropyl (meth)acrylate, EO-modified p-cumyl phenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, 1-naphtylmethyl (meth) acrylate, 2-naphtylmethyl (meth)acrylate, tetrahydrofurfuryl (meth)acrylate, butoxyethyl (meth)acrylate, ethoxydiethylene glycol (meth)acrylate, polyethylene glycol mono(meth) acrylate, polypropylene glycol mono(meth)acrylate, methoxyethylene glycol (meth)acrylate, ethoxyethyl (meth) acrylate, methoxypolyethylene glycol (meth)acrylate, methoxypolypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Commercially available examples of the monofunctional (meth)acrylic compound include, but not limited to, Aronix series M101, M102, M110, M111, M113, M117, M5700, TO-1317, M120, M150, and M156 (manufactured by Toa Gosei Co., Ltd.), MEDOL10, MIBDOL10, CHDOL10, MMDOL30, MEDOL30, MIBDOL30, CHDOL30, LA, IBXA, 2-MTA, HPA, Viscoat series #150, #155, #158, #190, #192, #193, #220, #2000, #2100, and #2150 (manufactured by Osaka Organic Chemical Industry Ltd.), Light Acrylate series BO-A, EC-A, DMP-A, THF-A, HOP-A, HOA-MPE, HOA-MPL, PO-A, P-200A, NP-4EA, and NP-8EA, and Epoxy Ester M-600A (manufactured by Kyoeisha Chemical Co., Ltd.), KAYARAD series TC110S, R-564, and R-128H (manufactured by Nippon Kayaku Co., Ltd.), NK Ester series AMP-10G and AMP-20G (manufactured by Shin-Nakamura Chemical Co., Ltd.), FA-511A, 512A, and 513A (manufactured by Hitachi Chemical Co., Ltd.), PHE, CEA, PHE-2, PHE-4, BR-31, BR-31M, and BR-32 (manufactured by Daiich Kogyo Seiyaku Co., Ltd.), VP (manufactured by BASF), and ACMO, DMAA, and DMAPAA (manufactured by Kohjin Co., Ltd.).

Examples of the multifunctional (meth)acrylic compound having two or more acryloyl or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethylol tricyclodecane di(meth)acrylate, pentaerythritol tri(meth)acrylate, pentaerythritol tetra(meth)acrylate, ethylene glycol di(meth)acrylate, tetraethylene glycol di(meth)acrylate, phenylethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantanedimethanol di(meth)acrylate, o-xylylene di(meth)acrylate, m-xylylene di(meth)acrylate, p-xylylene di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Commercially available examples of the multifunctional (meth)acrylic compound include, but not limited to, Yupimer UV series SA1002 and SA2007 (manufactured by Mitsubishi Chemical Corp.), Viscoat series #195, #230, #215, #260, #335HP, #295, #300, #360, and #700, GPT, and 3PA (manufactured by Osaka Organic Chemical Industry, Ltd.), Light Acrylate series 4EG-A, 9EG-A, NP-A, DCP-A, BP-4EA, BP-4PA, TMP-A, PE-3A, PE-4A, and DPE-6A (manufactured by Kyoeisha Chemical Co., Ltd.), KAYARAD series PET-30, TMPTA, R-604, DPHA, and DPCA-20, -30, -60, and -120, HX-620, D-310, and D-330 (manufactured by Nippon Kayaku Co., Ltd.), Aronix series M208, M210, M215, M220, M240, M305, M309, M310, M315, M325, and M400 (manufactured by Toa Gosei Co., Ltd.), and Ripoxy series VR-77, VR-60 and VR-90 (manufactured by Showa Denko Co., Ltd.).

In the above-mentioned compound groups, the term "(meth)acrylate" means acrylate and methacrylate having an alcohol residue equivalent to that of the acrylate; the term "(meth)acryloyl group" means an acryloyl group and a methacryloyl group having an alcohol residue equivalent to that of the acryloyl group; the term "EO" refers to ethylene oxide, and the term "EO-modified compound A" refers to a compound in which the (meth)acrylic acid residue of the compound A is bound to an alcohol residue via a block structure of an ethylene oxide group; and the term "PO" refers to propylene oxide, and the term "PO-modified compound B" refers to a compound in which the (meth)acrylic acid residue of the compound B is bound to an alcohol residue via a block structure of a propylene oxide group.

Among these compounds, component (A) can contain at least one, preferably at least two, selected from isobornyl acrylate, benzyl acrylate, 2-naphtylmethyl acrylate, neopentyl glycol diacrylate, 1,6-hexanediol diacrylate, dimethylol tricyclodecane diacrylate, phenylethylene glycol diacrylate, and m-xylylene diacrylate. Among these compounds, component (A) can be composed of isobornyl acrylate, benzyl acrylate, and neopentyl glycol diacrylate or can be composed of isobornyl acrylate and 1,6-hexanediol diacrylate or can be composed of benzyl acrylate and dimethylol tricyclodecane diacrylate or can be composed of benzyl acrylate and phenylethylene glycol diacrylate or can be composed of benzyl acrylate and m-xylylene diacrylate or can be composed of benzyl acrylate, 2-naphtylmethyl acrylate, and m-xylylene diacrylate.

Photopolymerization Initiator Component (B)

Component (B) is a photopolymerization initiator.

In this embodiment and the present invention, the photopolymerization initiator is a compound that perceives light of a predetermined wavelength and generates the polymerizing factor (radical). Specifically, the photopolymerization initiator is a polymerization initiator (radical generator) generating radicals by light (infrared rays, visible rays, ultraviolet rays, far ultraviolet rays, X-rays, charged particle rays such as electron beams, or radiation rays).

Component (B) may be composed of one photopolymerization initiator or may be composed of a plurality of photopolymerization initiators.

Examples of the radical generator include, but not limited to, optionally substituted 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives such as 2-benzyl-2-dimethylamino-1-(4-morpholinophenyl)-butanone-1,2-methyl-1-[4-(methylthio)phenyl]-2-morpholino-propanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methyl benzoin, ethyl benzoin, and propyl benzoin; benzyl derivatives such as benzyl dimethyl ketal; acridine derivatives such as 9-phenyl acridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexylphenyl ketone, and 2,2-dimethoxy-2-phenylacetophenone; thioxanthone derivatives such as thioxanthone, diethylthioxanthone, 2-isopropylthioxanthone, and 2-chlorothioxanthone; xanthones; fluorenones; benzaldehydes; fluorenes; anthraquinones; triphenylamines; carbazoles; and 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, bis(2,4,6-trimethylbenzoyl)phenylphosphine oxide, bis(2,6-dimethoxybenzoyl)-2,4,4-trimethylpentylphosphine oxide, 1,2-octanedion,1-[4-(phenylthio)-,2-(O-benzoyloxime)], and ethanone,1-[9-ethyl-6-(2-methylbenzoyl)-9H-carbazol-3-yl]-,1-(O-acetyloxime).

Commercially available examples of the photoradical generator include, but not limited to, Irgacure series 184, 369, 651, 500, 819, 907, 784, and 2959, CGI-1700, -1750, and -1850, CG24-61, and Darocur series 1116 and 1173, Lucirin TPO, LR8893, and LR8970 (manufactured by BASF), and Uvecryl P36 (manufactured by UCB).

The component (B) can be particularly an alkylphenone polymerization initiator, an oxime ester polymerization initiator, or an acylphosphine oxide polymerization initiator. In the above-mentioned examples, the alkylphenone polymerization initiators are benzoin ether derivatives such as benzoin methyl ether, benzoin ethyl ether, and benzoin phenyl ether; benzoin derivatives such as benzoin, methyl benzoin, ethyl benzoin, and propyl benzoin; benzyl derivatives such as benzyl dimethyl ketal; acetophenone derivatives such as acetophenone, 3-methylacetophenone, acetophenone benzyl ketal, 1-hydroxycyclohexylphenyl ketone, and 2,2-dimethoxy-2-phenylacetophenone; and α-amino aromatic ketone derivatives such as 2-benzyl-2-dimethylamino-1-(4-morpholinophenyl)-butanone-1 and 2-methyl-1-[4-(methylthio)phenyl]-2-morpholino-propanon-1-one.

In the above-mentioned examples, the oxime ester polymerization initiators are oxime ester compounds such as 1,2-octanedion,1-[4-(phenylthio)-,2-(O-benzoyloxime)] and ethanone,1-[9-ethyl-6-(2-methylbenzoyl)-9H-carbazol-3-yl]-,1-(O-acetyloxime).

In the above-mentioned examples, the acylphosphine oxide polymerization initiators are acylphosphine oxide compounds such as 2,4,6-trimethylbenzoyldiphenylphosphine oxide, bis(2,4,6-trimethylbenzoyl)phenylphosphine oxide, bis(2,6-dimethoxybenzoyl)-2,4,4-trimethylpentylphosphine oxide.

The component (B) can be particularly 2-benzyl-2-dimethylamino-1-(4-morpholinophenyl)-butanone-1 represented by the following Formula (a), 1,2-octanedion,1-[4-(phenylthio)-,2-(O-benzoyloxime)] represented by the following Formula (b), bis(2,4,6-trimethylbenzoyl)phenylphosphine oxide represented by the following Formula (e), or 2,4,6-trimethylbenzoyldiphenylphosphine oxide represented by the following Formula (c).

[Chem. 1]

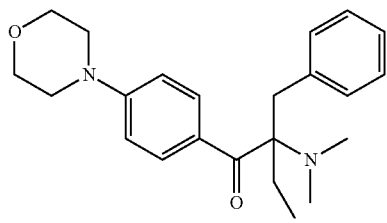

Formula (a)

[Chem. 2]

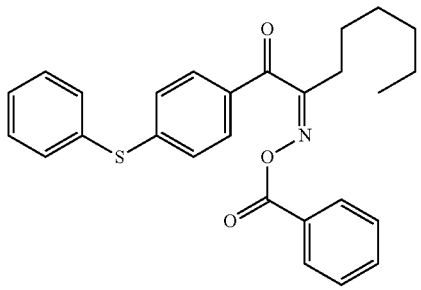

Formula (b)

[Chem. 3]

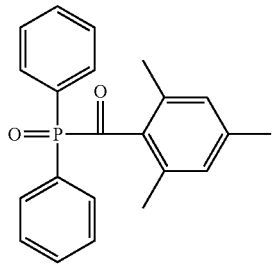

Formula (c)

[Chem. 4]

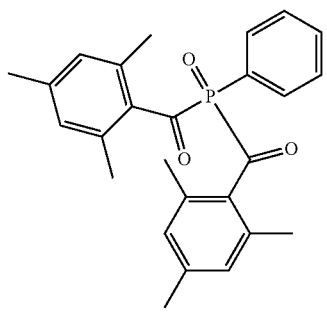

Formula (e)

The blending ratio of the polymerization initiator component (B) in the curable composition is 0.01% by weight or more and 10% by weight or less, preferably 0.1% by weight or more and 7% by weight or less, based on the total weight of the polymerizable compound component (A).

A blending ratio of the component (B) of 0.01% by weight or more based on the total weight of the polymerizable compound accelerates the curing rate of the composition and can increase the reaction efficiency. A blending ratio of the component (B) of 10% by weight or less based on the total weight of the polymerizable compound can provide a cured product having a certain amount of mechanical strength.

Other Components

The curable composition for photoimprint in this embodiment may further contain another component (C) according to various purposes within a range that does not impair the effects of the present invention, in addition to component (A) and component (B) described above. Examples of the component (C) include surfactants, sensitizers, hydrogen donors, antioxidants, solvents, and polymer components.

The sensitizer is appropriately added to the composition for accelerating the polymerization reaction or improving the reaction conversion rate. The sensitizer is, for example, a sensitizing dye.

The sensitizing dye is a compound that is excited by absorbing light of a specific wavelength and interacts with the polymerization initiator component (B). The interaction herein is, for example, energy transfer or electron transfer from the sensitizing dye in the excited state to the polymerization initiator component (B).

Examples of the sensitizing dye include, but not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

The sensitizers may be used alone or in combination of two or more thereof.

The sensitizer can be particularly a benzophenone sensitizer or a thioxanthone sensitizer.

In the above-mentioned examples, the benzophenone sensitizers are benzophenone compounds such as 4,4'-bis(dialkylamino)benzophenone.

In the above-mentioned examples, the thioxanthone sensitizers are thioxanthone compounds such as 2-isopropylthioxanthone.

The sensitizer can be particularly 4,4'-bis(diethylamino)benzophenone represented by the following Formula (f) or 2-isopropylthioxanthone represented by the following Formula (i):

[Chem. 5]

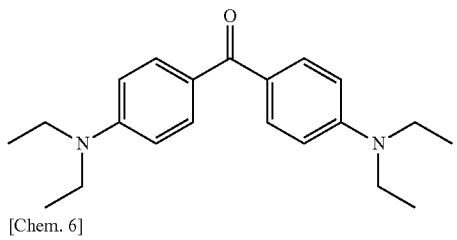

Formula (f)

[Chem. 6]

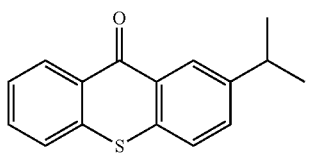

Formula (i)

The hydrogen donor is a compound that reacts with an initial radical generated from the polymerization initiator component (B) or a radical of the polymerization growth terminal and generates a radical having higher reactivity. The hydrogen donor can be added to the composition of which the polymerization initiator component (B) is a photo-radical generator.

Examples of the hydrogen donor include, but not limited to, amine compounds such as N-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylamino benzoate, triethanolamine, and N-phenylglycine; and mercapto compounds such as 2-mercapto-N-phenylbenzimidazole and mercaptopropionic acid ester.

The hydrogen donors may be used alone or in combination of two or more thereof.

The hydrogen donor may have a function as a sensitizer. Examples of the hydrogen donor having a function as a sensitizer include 4,4'-bis(dialkylamino)benzophenone mentioned above.

Examples of the 4,4'-bis(dialkylamino)benzophenone include 4,4'-bis(diethylamino)benzophenone and its derivatives. The 4,4'-bis(dialkylamino)benzophenone can be particularly 4,4'-bis(diethylamino)benzophenone represented by the following Formula (f):

[Chem. 7]

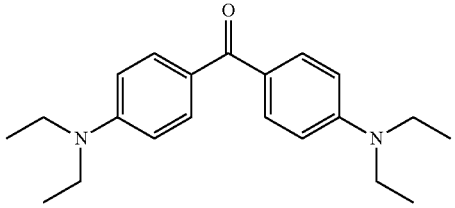

Formula (f)

When the curable composition of this embodiment contains a sensitizer or a hydrogen donor, the amount thereof is preferably 0.1% by weight or more and 20% by weight or less, more preferably 0.1% by weight or more and 5.0% by weight or less, and most preferably 0.2% by weight or more and 2.0% by weight or less, based on the total weight of the polymerizable compound component (A). A sensitizer in an amount of 0.1% by weight or more based on the total weight of component (A) can more effectively show the effect of accelerating the polymerization. A sensitizer or hydrogen donor in a content of 5.0% by weight or less can provide a sufficiently large molecular weight of the polymer compound constituting the resulting photocured product and can be prevented from insufficient dissolution into the curable composition for photoimprint and deterioration in storage stability of the curable composition for photoimprint.

The curable composition for photoimprint can contain a surfactant for reducing the interface bonding force between the mold and the resist.

The surfactant can be a silicone surfactant or a fluorine surfactant. From the viewpoint of an excellent effect of reducing the mold-releasing force, a fluorine surfactant can be used. In the present invention, the surfactant is not polymerizable.

Examples of the fluorine surfactant include polyalkylene oxide (e.g., polyethylene oxide or polypropylene oxide) adducts of alcohols having perfluoroalkyl groups and polyalkylene oxide (e.g., polyethylene oxide or polypropylene oxide) adducts of perfluoropolyethers. The fluorine surfactant may include, for example, a hydroxyl group, an alkyl group, an amino group, or a thiol group at a part of the molecular structure (e.g., terminal group). The surfactant may be a commercially available one.

The surfactant may be a hydrocarbon surfactant.

Examples of the hydrocarbon surfactant include polyalkylene oxide adducts of alkyl alcohols in which alkylene oxide having 2 to 4 carbon atoms is added to alkyl alcohol having 1 to 50 carbon atoms.

Examples of the polyalkylene oxide adducts of alkyl alcohols include an ethylene oxide adduct of methyl alcohol, an ethylene oxide adduct of decyl alcohol, an ethylene oxide adduct of lauryl alcohol, an ethylene oxide adduct of cetyl alcohol, an ethylene oxide adduct of stearyl alcohol, and an ethylene oxide/propylene oxide adduct of stearyl alcohol. The terminal group of the polyalkylene oxide adduct of alkyl alcohol is not limited to a hydroxyl group, which can be produced by simply adding a polyalkylene oxide to alkyl alcohol. The hydroxyl group may be replaced by another substituent, e.g., a polar functional group such as a carboxyl group, an amino group, a pyridyl group, a thiol group, or a silanol group, or a hydrophobic functional group such as an alkyl group.

The polyalkylene oxide adduct of alkyl alcohol may be a commercially available one. Examples of the commercially available adduct include polyoxyethylene methyl ether (ethylene oxide adduct of methyl alcohol) (BLAUNON MP-400, BLAUNON MP-550, BLAUNON MP-1000) manufactured by Aoki Oil Industrial Co., Ltd., polyoxyethylene decyl ether (ethylene oxide adduct of decyl alcohol) (FINESURF D-1303, FINESURF D-1305, FINESURF D-1307, FINESURF D-1310) manufactured by Aoki Oil Industrial Co., Ltd., polyoxyethylene lauryl ether (ethylene oxide adduct of lauryl alcohol) (BLAUNON EL-1505) manufactured by Aoki Oil Industrial Co., Ltd., polyoxyethylene cetyl ether (ethylene oxide adduct of cetyl alcohol) (BLAUNON CH-305, BLAUNON CH-310) manufactured by Aoki Oil Industrial Co., Ltd., polyoxyethylene stearyl ether (ethylene oxide adduct of stearyl alcohol) (BLAUNON SR-705, BLAUNON SR-707, BLAUNON SR-715, BLAUNON SR-720, BLAUNON SR-730, BLAUNON SR-750) manufactured by Aoki Oil Industrial Co., Ltd., random copolymer type polyoxyethylene polyoxypropylene stearyl ether (BLAUNON SA-50/50 1000R, BLAUNON SA-30/70 2000R) manufactured by Aoki Oil Industrial Co., Ltd., polyoxyethylene methyl ether (Pluriol 760E) manufactured by BASF, and polyoxyethylene alkyl ether (Emulgen series) manufactured by Kao.

The surfactant can be particularly the hydrocarbon surfactant represented by the following Formula (o):

[Chem. 8]

Formula (o)

In Formula (o), Rc represents a monovalent hydrocarbon group having 5 to 50 carbon atoms; Ra represents an alkylene group; m represents an integer of 1 to 10; and X represents an alkoxy group, a hydroxyl group, a carboxyl group, a pyridyl group, a silanol group, or a sulfo group. The surfactants may be used alone or in combination of two or more thereof.

When the curable composition for photoimprint of this embodiment contains a surfactant, the amount thereof is, for example, 0.001% by weight or more and 10% by weight or less, preferably 0.01% by weight or more and 7% by weight or less, and more preferably 0.05% by weight or more and 5% by weight or less, based on the total weight of the polymerizable compound component (A). An amount in the range of 0.001% by weight or more and 10% by weight or less can impart an effect of reducing the mold-releasing force to the curable composition for photoimprint and can show an effect of providing an excellent filling property.

The ratios of component (A) and component (B) can be determined by analyzing the photocured product prepared by exposing a curable composition of this embodiment to light by, for example, infrared spectroscopy, ultraviolet-visible spectroscopy, or pyrolytic gas chromatography mass spectrometry. As a result, the ratios of component (A) and component (B) in the curable composition can be determined.

Temperature of Curable Composition for Photoimprint During Mixing

The curable composition for photoimprint of this embodiment prepared by mixing and dissolving at least component (A) and component (B) at a predetermined temperature, specifically, within a range of 0° C. or more and 100° C. or less.

Viscosity of Curable Composition for Photoimprint

The viscosity at 23° C. of a mixture of the components excluding the solvent of the curable composition for photoimprint of this embodiment is preferably 1 cP or more and 100 cP or less, more preferably 5 cP or more and 50 cP or less, and most preferably 6 cP or more and 20 cP or less.

A viscosity of the curable composition for photoimprint of 100 cP or less prevents the time for filling the concavities of the fine pattern on a mold with the curable composition for photoimprint from getting longer and also hardly causes a pattern defect due to filling failure.

A viscosity of 1 cP or more hardly causes uneven coating in the application of the curable composition for photoimprint onto a substrate and prevents the curable composition for photoimprint from flowing out from the end of a mold when it becomes in contact with the mold.

Surface Tension of Curable Composition for Photoimprint

The surface tension at 23° C. of a mixture of the components excluding the solvent of the curable composition for photoimprint of this embodiment is preferably 5 mN/m or more and 70 mN/m or less, more preferably 7 mN/m or more and 35 mN/m or less, and most preferably 10 mN/m or more and 32 mN/m or less. A surface tension of 5 mN/m or more can prevent the time for filling the concavities of the fine pattern on a mold with the curable composition for photoimprint from getting longer when it becomes in contact with the mold.

A surface tension of 70 mN/m or less provides smoothness to the surface of a cured product prepared by exposing the curable composition for photoimprint to light.

Impurities in Curable Composition for Photoimprint

The curable composition for photoimprint of this embodiment does not contain impurities as much as possible. The impurities described here refer to those other than component (A), component (B), and other components (C) described above.

Accordingly, the curable composition for photoimprint may be prepared through a purification step. The purification step can be, for example, filtration through a filter.

The filtration with a filter can be performed by, specifically, filtering a mixture of component (A), component (B), and other optional components described above through a filter having a pore diameter of 0.001 μm or more and 5.0 μm or less for example. The filtration through a filter can be multi-stage filtration or may be repeated multiple times. The filtrate may be re-filtered. The filtration may be performed through a plurality of filters having different pore diameters. The filter for the filtration may be any filter and is made of, for example, a polyethylene resin, polypropylene resin, fluorine resin, or nylon resin.

Such a purification step can remove impurities such as particles contaminating the curable composition for photoimprint. As a result, a pattern default caused by careless generation of irregularity, due to impurities such as particles, in a photocured product prepared by curing the curable composition for photoimprint can be prevented from occurring.

In a case of using the curable composition for photoimprint of this embodiment for producing a semiconductor integrated circuit, contamination of the curable composition for photoimprint by impurities (metal impurities) having metal atoms should be prevented as much as possible, in order not to obstruct the behavior of the product. Accordingly, the concentration of metal impurities contained in the curable composition for photoimprint should be 10 ppm or less, preferably 100 ppb or less.

Preferred Combination

The curable composition for photoimprint of the present invention can be prepared by combining components (A), (B), and (C) mentioned above.

In particular, the composition can include a component (A) containing a monofunctional compound composed of isobornyl acrylate or isobornyl acrylate and benzyl acrylate and a multifunctional compound composed of neopentyl glycol diacrylate or 1,6-hexanediol diacrylate or dimethylol tricyclodecane diacrylate, wherein the weight ratio of the monofunctional compound and the multifunctional compound is 1:1 to 3:1, and component (B) containing at least one of the compounds represented by the following Formulae (a), (b), (c), and (e).

[Chem. 9]

Formula (a)

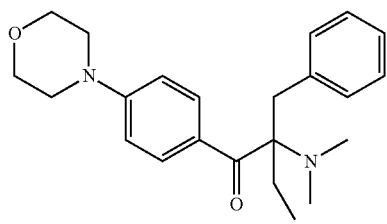

[Chem. 10]

Formula (b)

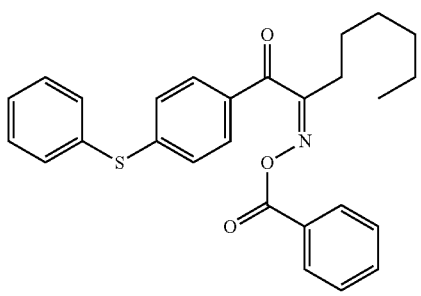

[Chem. 10]

Formula (c)

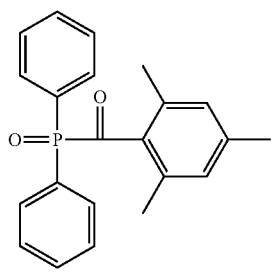

[Chem. 12]

Formula (e)

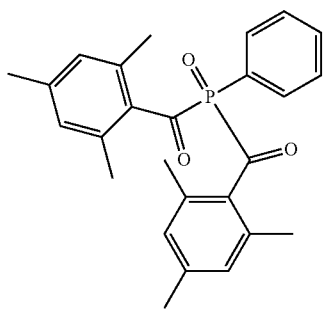

The composition can further contain a sensitizer represented by Formula (f):

[Chem. 13]

Formula (f)

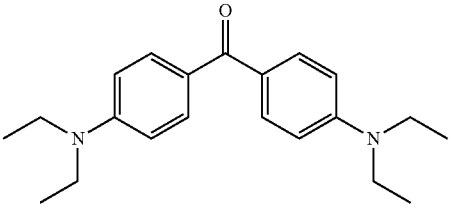

The composition can further contain a mold release agent represented by Formula (g):

[Chem. 14]

Formula (g)

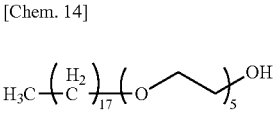

In particular, the composition can mainly contain component (A) such as 90% or more of the total amount of the curable composition for photoimprint.

Cured Film

A cured film can be formed by exposing a coating film of the curable composition for photoimprint to light. An example of the method of forming a coating film of the curable composition for photoimprint is described in arrangement step [1] in a method of producing a film having a pattern described below. An example of the method of curing a coating film is described in light irradiation step [4] irradiating a curable composition for photoimprint with light in the method of producing a film having a pattern described below.

Measurement of Young's Modulus and Reduced Modulus of Cured Film

The Young's modulus and the reduced modulus of a resulting cured film can be measured by, for example, nanoindentation. The nanoindentation is a method of simultaneously measuring the load and the displacement by pushing a penetrator into a desired place of a sample to be measured. The solidity and Young's modulus (elastic modulus) of the sample can be determined from the resulting load-displacement curve.

Examples of measuring apparatuses include Nano Indenter G200 (manufactured by Agilent Technologies, Inc.), ENT series (manufactured by Elionix Inc.), and TI series (manufactured by Hysitron, Inc.).

According to a first aspect of the present invention, the curable composition for photoimprint of this embodiment satisfies the following expression (1) and (2):

$$0.800 \leq Er_{10}/Er_{200} \quad (1)$$

$$2.55 \text{ GPa} \leq Er_{10} \quad (2)$$

wherein, $Er_{10}$ represents the reduced modulus (GPa) of a cured film prepared by exposing a film of the curable composition for photoimprint to light of 10 mJ/cm$^2$; and $Er_{200}$ represents the reduced modulus (GPa) of a cured film prepared by exposing a film of the curable composition for photoimprint to light of 200 mJ/cm$^2$.

The curable composition for photoimprint satisfying expression (1) can also further satisfy expression (3):

$$0.855 \leq Er_{10}/Er_{200} \leq 0.993 \quad (3)$$

In expression (3), $Er_{10}$ and $Er_{200}$ are respectively the same as $Er_{10}$ and $Er_{200}$ in expression (1), that is, $Er_{10}$ represents the reduced modulus (GPa) of a cured film prepared by exposing a film of the curable composition for photoimprint to light of 10 mJ/cm²; and $Er_{200}$ represents the reduced modulus (GPa) of a cured film prepared by exposing a film of the curable composition for photoimprint to light of 200 mJ/cm².

The curable composition for photoimprint satisfying expression (2) can also further satisfy expression (4):

$$2.81 \text{ GPa} \leq Er_{10} \leq 3.27 \quad (4)$$

In expression (4), $Er_{10}$ is respectively the same as $Er_{10}$ in expression (1), that is, $Er_{10}$ represents the reduced modulus (GPa) of a cured film prepared by exposing a film of the curable composition for photoimprint to light of 10 mJ/cm².

According to a second aspect of the present invention, the curable composition for photoimprint of this embodiment satisfies the following expression (5) and (6):

$$0.880 \leq E_{10}/E_{200} \quad (5)$$

$$4.00 \text{ GPa} \leq E_{10} \quad (6)$$

wherein, $E_{10}$ represents the Young's modulus (GPa) of a cured film prepared by exposing a film of the curable composition for photoimprint to light of 10 mJ/cm²; and $E_{200}$ represents the Young's modulus (GPa) of a cured film prepared by exposing a film of the curable composition for photoimprint to light of 200 mJ/cm².

The curable composition for photoimprint satisfying expression (5), even in exposure of the curable composition for photoimprint to a low light exposure amount of 10 mJ/cm², can provide a cured product having a degree of cure equivalent to that in exposure of the curable composition for photoimprint to a high light exposure amount of 200 mJ/cm².

The curable composition for photoimprint of this embodiment may satisfy both expressions (1) and (5).

The curable composition for photoimprint of this embodiment may satisfy both expressions (2) and (6).

The figure, 0.880, is 0.88 when expressed with two decimal places, and expression (5) can also be represented as $0.88 \leq E_{10}/E_{200}$ when expressed with two decimal places.

The Young's modulus can be determined as an average of Young's moduli measured at an indentation depth of 100 to 150 nm by a continuous stiffness measurement (CSM) method with Nano Indenter G200 (manufactured by Agilent Technologies, Inc.). The thickness of a film of the curable composition for photoimprint is adjusted to 3.2 μm in both cases of exposure to light of 10 mJ/cm² and 200 mJ/cm². The Young's modulus of a cured film can be measured, for example, after 24 hours from the exposure of a film of the curable composition for photoimprint to light.

The curable composition for photoimprint satisfying expression (5) can also further satisfy expression (7):

$$0.956 \leq E_{10}/E_{200} \leq 1.05 \quad (7)$$

In expression (7), $E_{10}$ and $E_{200}$ are respectively the same as $E_{10}$ and $E_{200}$ in expression (5), that is, $E_{10}$ represents the Young's modulus (GPa) of a cured film prepared by exposing a film of the curable composition for photoimprint to light of 10 mJ/cm²; and $E_{200}$ represents the Young's modulus (GPa) of a cured film prepared by exposing a film of the curable composition for photoimprint to light of 200 mJ/cm².

The curable composition for photoimprint satisfying expression (6) can also satisfy expression (8):

$$4.17 \text{ GPa} \leq E_{10} \leq 5.94 \text{ GPa} \quad (8)$$

In expression (8), $E_{10}$ is the same as $E_{10}$ in expression (5), that is, $E_{10}$ represents the Young's modulus (GPa) of a cured film prepared by exposing a film of the curable composition for photoimprint to light of 10 mJ/cm².

Method of Producing Film Having Pattern

A method of producing a film having a pattern of this embodiment will now be described.

FIGS. 1A to 1G are schematic cross-sectional views illustrating an example of a method of producing a film having a pattern of this embodiment.

The method of producing a film having a pattern of this embodiment includes:

an arrangement step [1] arranging the curable composition for photoimprint of the embodiment described above on a substrate;

a mold contact step [2] bringing the curable composition for photoimprint into contact with a mold;

an alignment step [3] adjusting the positions of the mold and the substrate to be machined;

a light irradiation step [4] irradiating the curable composition for photoimprint with light; and a mold-releasing step [5] detaching the cured product prepared in the step [4] from the mold.

The method of producing a film having a pattern of this embodiment utilizes a photo-nanoimprint method.

In the film prepared by the method of producing a film having a pattern of this embodiment, the pattern preferably has a size of 1 nm or more and 10 mm or less, more preferably 10 nm or more and 100 μm or less. In general, pattern-forming technology for producing a film having a pattern (irregular structure) with a nanosize (1 nm or more and 100 nm or less) by using light is called a photo-nanoimprint method. The method of producing a film having a pattern of this embodiment utilizes the photo-nanoimprint method.

Each step will now be described.

Arrangement Step [1]

This step (arrangement step) forms a coating film by, as shown in FIG. 1A, arranging (applying) the curable composition for photoimprint 101 of this embodiment described above on a substrate 102.

The substrate 102 on which the curable composition for photoimprint 101 is arranged is the substrate to be machined and is usually a silicon wafer.

The substrate 102 is, however, not limited to silicon wafers and may be appropriately selected from substrates for semiconductor devices, such as aluminum, titanium-tungsten alloy, aluminum-silicon alloy, aluminum-copper-silicon alloy, silicon oxide, and silicon nitride substrates. The substrate 102 (substrate to be machined) may be provided with surface treatment such as silane coupling treatment, silazane treatment, or formation of an organic thin film, for improving the adhesion with the curable composition for photoimprint.

The curable composition for photoimprint of this embodiment can be arranged on a substrate to be machined by, for example, ink jetting, dip coating, air knife coating, curtain coating, wire bar coating, gravure coating, extrusion coating, spin coating, or slit scanning. Though the thickness of the layer to be subjected to shape transfer (coating film) varies depending on the use, it can be, for example, 0.01 or more and 100.0 μm or less. In the photo-nanoimprint method, ink jetting can be particularly used.

Mold Contact Step [2] of Curable Composition for Photoimprint and Mold

Subsequently, as shown in FIG. 1B, the coating film consisting of the curable composition for photoimprint 101 formed in the previous step (arrangement step) is brought into contact with a mold 104 having a mold pattern for transferring the pattern. In this step, a mold 104 is brought into contact with the curable composition for photoimprint 101 (layer to be subjected to shape transfer) (FIG. 1B (b-1)) to fill the concavities of the fine pattern on the surface of the mold 104 with (a part of) the coating film consisting of the curable composition for photoimprint 101, resulting in formation of a coating film 106 filled in the fine pattern of the mold (FIG. 1B (b-2)).

The mold 104 needs to be made of a light-permeable material considering the subsequent step (light irradiation step). The material constituting the mold 104 can be, for example, glass, quartz, PMMA, a light-permeable resin such as a polycarbonate resin, a transparent metal vapor-deposited film, a flexible film made of, e.g., polydimethylsiloxane, a photocured film, or a metal film. When the mold 104 is made of a light-permeable resin, the resin is required not to be dissolved in the solvent contained in the curable composition for photoimprint 101. Quartz has a small thermal expansion coefficient and low pattern distortion and can be therefore particularly used.

The mold 104 may be subjected to surface treatment for improving the detachability between the curable composition for photoimprint 101 and the surface of the mold 104, prior to this mold contact step of bringing the curable composition for photoimprint into contact with the mold. The surface treatment is performed by, for example, applying a mold release agent to the surface of a mold to form a mold release agent layer. Examples of the mold release agent to be applied to the surface of a mold include silicon-based mold release agents, fluorine-based mold release agents, polyethylene-based mold release agents, polypropylene-based mold release agents, paraffin-based mold release agents, montan-based mold release agents, and carnauba-based mold release agents. Commercially available application-type mold release agents such as Optool DSX manufactured by Daikin Industries, Ltd. can also be used. These mold release agents may be used alone or in combination of two or more thereof. In particular, the fluorine-based mold release agents can be used.

In this step (mold contact step), as shown in FIG. 1B (b-1), the pressure that is applied to the curable composition for photoimprint when it is brought into contact with the mold 104 is not particularly limited and is usually 0 MPa or more and 100 MPa or less, preferably 0 MPa or more and 50 MPa or less, more preferably 0 MPa or more and 30 MPa or less, and most preferably 0 MPa or more and 20 MPa or less.

In this step, the mold 104 may be in contact with the curable composition for photoimprint 101 for any period of time and is usually for 0.1 sec or more and 600 sec or less, preferably 0.1 sec or more and 300 sec or less, more preferably 0.1 sec or more and 180 sec or less, and most preferably 0.1 sec or more and 120 sec or less.

This step can be performed under the atmosphere, a reduced-pressure atmosphere, or an inert gas atmosphere and can be particularly performed under a reduced-pressure atmosphere or an inert gas atmosphere for preventing influence of oxygen and moisture on the photocuring reaction. Examples of the inert gas that can be used in the case of performing this step under an inert gas atmosphere include nitrogen, carbon dioxide, helium, argon, and various chlorofluorocarbon gases, and also gas mixtures thereof. When this step is performed under a specific gaseous atmosphere, including the atmosphere, the pressure can be 0.0001 atmospheres or more and 10 atmospheres or less.

The mold contact step may be performed under an atmosphere containing a condensable gas (hereinafter, referred to as condensable gas atmosphere). In the present invention and the specification, the condensable gas is defined as a gas that is in the gaseous state in the atmosphere before the contact of the curable composition for photoimprint 101 (layer to be subjected to shape transfer) and the mold 104 in the mold contact step (FIG. 1B (b-1)) and liquefies by the condensation due to the capillary pressure generated by the pressure occurring when the gas in the atmosphere is, together with (a part of) the coating film 106, filled in the concavities of the fine pattern formed on the mold 104 by the contact of the curable composition for photoimprint 101 (layer to be subjected to shape transfer) with the mold 104 and filled in the gap between the mold and the substrate.

When the mold contact step is performed under a condensable gas atmosphere, the gas filled in the concavities of the fine pattern is liquefied to eliminate the gas bubbles, resulting in an excellent filling property. The condensable gas may be dissolved in the curable composition for photoimprint.

The condensable gas may have any boiling point that is not higher than the ambient temperature in the mold contact step. The boiling point is preferably −10° C. to 23° C. and more preferably 10° C. to 23° C. A boiling point within this range can provide a further excellent filling property.

The condensable gas at the ambient temperature in the mold contact step can have any vapor pressure that is not higher than the mold pressure in the pressing in the mold contact step, and the vapor pressure can be 0.1 to 0.4 MPa. A vapor pressure within this range can provide a further excellent filling property. In a vapor pressure at an ambient temperature of higher than 0.4 MPa, the effect by elimination of the gas bubbles is apt to be insufficient. In contrast, in a vapor pressure at an ambient temperature of lower than 0.1 MPa, a reduction in pressure is necessary, resulting in a tendency of complicating the apparatus.

The ambient temperature in the mold contact step is not particularly limited and can be 20° C. to 25° C.

Examples of the condensable gas include fluorocarbons, e.g., chlorofluorocarbons (CFCs) such as trichlorofluoromethane; hydrofluorocarbons (HFCs) such as fluorocarbon (FC), hydrochlorofluorocarbon (HCFC), and 1,1,1,3,3-pentafluoropropane ($CHF_2CH_2CF_3$, HFC-245fa, PFP); and hydrofluoroethers (HFEs) such as pentafluoroethylmethylether ($CF_3CF_2OCH_3$, HFE-245mc).

Among these fluorocarbons, from the viewpoint of an excellent filling property at an ambient temperature of 20° C. to 25° C. in the mold contact step, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethylmethylether can be particularly used. Furthermore, from the viewpoint of excellent safety, 1,1,1,3,3-pentafluoropropane can be particularly used.

The condensable gas may be used alone or in combination of two or more thereof. Furthermore, these condensable gases may be used as gas mixtures with non-condensable gases such as air, nitrogen, carbon dioxide, helium, and argon. The non-condensable gas mixed with a condensable gas can be helium from the viewpoint of the filling property.

Helium can permeate through the mold simultaneous with the liquefaction of the condensable gas when the gases (condensable gas and helium) in the atmosphere are, together with (a part of) the coating film 106, filled in the concavities of the fine pattern formed on the mold 104 in the mold contact step.

Alignment Step [3] of Mold and Substrate to be Machined

Subsequently, as shown in FIG. 1C, the position of the substrate to be machined is adjusted such that the positioning marks 105 of the mold correspond to the positioning marks 103 of the substrate to be machined.

Light Irradiation Step [4] Irradiating Curable Composition for Photoimprint with Light Subsequently, in the positioned state in the step [3] as shown in FIG. 1D, the curable composition for photoimprint at the portion being in contact with the mold, in more detail, the coating film 106 filled in the fine pattern of the mold, is irradiated with light via the mold (FIG. 1D (d-1)). The coating film 106 filled in the fine pattern of the mold 104 is cured by irradiation with light into a cured film 108 (FIG. 1D (d-2)).

The light irradiated to the curable composition for photoimprint 101 constituting the coating film 106 filled in the fine pattern of the mold is selected depending on the sensitive wavelength of the curable composition for photoimprint 101. Specifically, the light is appropriately selected from, for example, ultraviolet light having a wavelength of 150 nm or more and 400 nm or less, X-rays, and electron rays.

Many of commercially available curing aids (photopolymerization initiators) show sensitivity to ultraviolet light, and therefore ultraviolet light can be particularly used as the light (irradiation light 107) to be irradiated to the curable composition for photoimprint 101. Examples of light sources emitting ultraviolet light include high-pressure mercury lamps, ultra-high pressure mercury lamps, low-pressure mercury lamps, Deep-UV lamps, carbon arc lamps, chemical lamps, metal halide lamps, xenon lamps, KrF excimer lasers, ArF excimer lasers, and $F_2$ excimer lasers. In particular, the ultra-high pressure mercury lamps can be used. The light sources may be used alone or in combination. The coating film 106 filled in the fine pattern of the mold may be entirely irradiated with light or may be partially irradiated with light.

The light irradiation onto the substrate may be dividedly performed in plural times. For example, a partial region A can be irradiated with light in a first irradiation step, and a region B other than the region A can be irradiated with light in a second irradiation step.

On this occasion, the curable composition for photoimprint of the embodiment described above can be cured with a small amount of light.

That is, the curable composition for photoimprint, even in irradiation with a low light exposure amount of 10 mJ/cm$^2$, can be cured to a degree of cure equivalent to that by irradiation with a high light exposure amount of 200 mJ/cm$^2$.

Accordingly, the curable composition for photoimprint can be cured with a low light exposure amount (10 mJ/cm$^2$ or more and 75 mJ/cm$^2$ or less, more preferably 10 mJ/cm$^2$ or more and 30 mJ/cm$^2$ or less) such that the thermal stain in the substrate due to expansion of the substrate by heat (exposure heat) generated by light absorbed by the substrate hardly reaches the region adjoining the region A where the light is irradiated. Accordingly, a defect of destroying the pattern hardly occurs in the subsequent mold-releasing step, and the alignment precision in the step [3] is hardly decreased when the steps of [1] to [5] are conducted at the adjacent portion.

The thermal expansion amount of the substrate by exposure can be calculated as follows.

For example, the thermal expansion amount when a silicon substrate (linear thermal expansion coefficient: 2.6 ppm/K) to be machined is exposed to ultraviolet light at a light exposure amount of 90 mJ/cm$^2$ in a rectangular exposure region of 26×33 mm causes, according to calculations, a thermal distortion of 2.9 nm at most at the end of the light exposure region.

Mold-releasing Step [5] Detaching Cured Product from Mold

Subsequently, the cured film 108 is detached from the mold 104 to form a cured film 109 having a predetermined pattern on the substrate 102.

In this step (mold-releasing step), as shown in FIG. 1E, the cured film 108 is detached from the mold 104 to give a cured film 109 having a pattern inverted from the fine pattern on the mold 104 in the step [4] (light irradiation step).

When the mold contact step is performed under a condensable gas atmosphere, the condensable gas vaporizes in association with a decrease in pressure of the interface between the cured film 108 and the mold 104 at the time of detaching the cured film 108 from the mold 104 in the mold-releasing step and tends to show an effect of reducing the mold-releasing force.

The cured film 108 may be detached from the mold 104 by any method that does not physically break a part of the cured film 108, and the conditions for the detachments are not particularly limited. For example, the mold 104 may be released by fixing the substrate 102 (substrate to be machined) and shifting the mold 104 so as to detach from the substrate 102 or by fixing the mold 104 and shifting the substrate 102 so as to detach from the mold 104 or pulling the both in opposite directions from each other.

The producing process including the steps [1] to [5] can provide a cured film having a desired irregular pattern (based on the irregular pattern of the mold 104) at a desired position. The resulting cured film can also be used as an optical member (including a case of being used as a part constituting an optical member) such as a Fresnel lens or a diffraction grating. In such a case, the optical member at least includes the substrate 102 and the cured film 109 having a pattern disposed on the substrate 102.

In the method of producing a film having a pattern in this embodiment, a repeating unit (shot) consisting of steps [1] to [5] can be repeated on a single substrate for plural times. A cured film having a plurality of desired irregular patterns (based on the irregular pattern of the mold 104) at desired positions of the substrate to be machined can be prepared by repeating the repeating unit (shot) consisting of steps [1] to [5] for plural times.

In particular, in steps [1] to [5] constituting one shot, the time from the completion of the step [4] in the first shot to the completion of the step [3] in the second shot can be within 1.2 seconds. Thus, the film having a pattern can be produced at high throughput.

Remaining Film-removing Step [6] Removing Part of Cured Film

The cured film prepared in mold-releasing step [5] has a specific pattern, and a part of the film may also remain at a region other than the region having the pattern (hereinafter, such the part of the film may be called remaining film). In such a case, as shown in FIG. 1F, the part of the cured film (remaining film), which is the region that should be removed from the resulting cured film having a pattern, is removed to give a patterned cured product 110 having a desired irregular pattern (based on the pattern of the mold 104).

The remaining film can be removed by, for example, removing the concavity regions (remaining film) of the cured film 109 by a method such as etching to expose the surface of the substrate 102 at the concavity regions of the pattern of the cured film 109.

The etching for removing the film at the concavity regions of the cured film 109 can be performed by any known method such as dry etching. The dry etching can be performed with a known dry etching apparatus. The source gas for dry etching is appropriately selected depending on the element composition of the cured film to be etched. Examples of the source gas include halogen gases such as $CF_4$, $C_2F_6$, $C_3F_8$, $CCl_2F_2$, $CCl_4$, $CBrF_3$, $BCl_3$, $PCl_3$, $SF_6$, and $Cl_2$; oxygen-containing gases such as $O_2$, CO, and $CO_2$; inert gases such as He, $N_2$, and Ar; and gases such as $H_2$ and $NH_3$. These gases may be used as a mixture thereof.

The producing process including the steps [1] to [6] can provide a patterned cured product 110 having a desired irregular pattern (based on the irregular pattern of the mold 104) at a desired position and can thus provide an article having a patterned cured product. Furthermore, when the substrate 102 is processed using the resulting patterned cured product 110, a substrate-processing step (step [7]) described below is performed.

Alternatively, the resulting patterned cured product 110 can be used as an optical member (including a case of being used as a part constituting an optical member) such as a diffraction grating or a polarizing plate to provide an optical component. In such a case, an optical component at least including a substrate 102 and a patterned cured product 110 disposed on the substrate 102 can be provided.

Substrate-processing Step [7]

The patterned cured product 110 having an irregular pattern prepared by the method of producing a film having a pattern of the embodiment can also be used as an interlayer insulating film of an electronic component represented by a semiconductor device such as an LSI, system LSI, DRAM, SDRAM, RDRAM, or D-RDRAM or as a resist film in production of semiconductor devices.

In the case of using the patterned cured product 110 as a resist film, a part of the substrate surface exposed in the etching step [6] (the region 111 in FIG. 1F) is etched or implanted with ions. On this occasion, the patterned cured product 110 functions as an etching mask. As a result, a circuit structure 112 based on the pattern of the patterned cured product 110 (FIG. 1G) can be formed on the substrate 102. Consequently, a circuit board to be used for, for example, a semiconductor device can be produced. The circuit board may be provided with a circuit controlling mechanism to be formed into an electronic component such as a display, camera, or medical device.

Similarly, etching or ion implantation may be performed by using the patterned cured product 110 as a resist film to obtain an optical component.

When a substrate having a circuit pattern or an electronic component is produced, the patterned cured product 110 may be finally removed from the processed substrate or may be left as a member constituting a device.

EXAMPLES

The present invention will now be described in more detail by examples, but the technical scope of the present invention is not limited to the examples described below.

Example 1

(1) Preparation of Curable Composition for Photoimprint (a-1)

Component (A) and component (B) shown below were mixed. The mixture was filtered through an ultra-high molecular weight polyethylene filter of a pore size of 0.2 μm to prepare a curable composition for photoimprint (a-1) of Example 1.

(1-1) Component (A): 94 Parts by Weight in Total

<A-1> Isobornyl acrylate (manufactured by Kyoeisha Chemical Co., Ltd., trade name: IB-XA): 9.0 parts by weight <A-2> Benzyl acrylate (manufactured by Osaka Organic Chemical Industry Ltd., trade name: V#160): 38.0 parts by weight <A-3> Neopentyl glycol diacrylate (manufactured by Kyoeisha Chemical Co., Ltd., trade name: NP-A): 47.0 parts by weight (1-2) Component (B): 3 Parts by Weight in Total <B-1> Irgacure 369 (manufactured by BASF): 3 parts by weight

[Chem. 15]

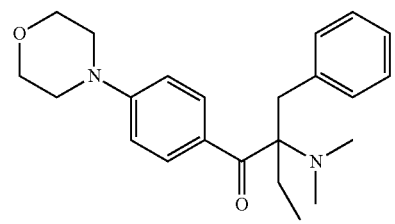

Formula (a)

(2) Production of Cured Film of Curable Composition for Photoimprint

Two microliters of the prepared curable composition for photoimprint (a-1) was dropwise applied onto a silicon wafer provided with an adhesion-accelerating layer having a thickness of 3 nm serving as an adhesion layer. The applied composition was covered with quartz glass having a thickness of 1 mm to fill a region of 25×25 mm with the curable composition for photoimprint (a-1).

Subsequently, the coating film was irradiated with light emitted from a UV light source equipped with a high-pressure mercury lamp and passed through an interference filter described below for 10 seconds through the quartz glass. The interference filter used in the light irradiation was VPF-25C-10-15-31300 (manufactured by Sigma Koki Co., Ltd.), which isolated light with a single wavelength of 313±5 nm and an illumination of 1 mW/cm² from the ultraviolet light as the irradiation light.

After the light irradiation, the quartz glass was removed to give a cured film (a-1-10) having an average thickness of 3.2 μm on a silicon wafer produced by exposing the curable composition for photoimprint (a-1) to light of 10 mJ/cm².

Similarly, a cured film (a-1-200) having an average thickness of 3.2 μm was produced on a silicon wafer by exposing the curable composition for photoimprint (a-1) to light of 200 mJ/cm² for 200 seconds.

(3-1) Measurement of Young's Modulus of Cured Film

The Young's moduli of the resulting cured films (a-1-10) and (a-1-200) were measured after 24 hours from the light exposure with a nanoindenter device (Nano Indenter G200, manufactured by Agilent Technologies, Inc.). The Young's modulus was determined by a continuous stiffness measurement (CSM) method, dynamic testing, as an average of Young's moduli obtained in a range of 100 to 150 nm when a penetrator was pushed by 500 nm in the depth direction from the surface of the cured film at a certain point and repeating the measurement at 15 points and calculating the average of the measured moduli.

The Young's modulus $E_{10}$ of cured film (a-1-10) and the Young's modulus $E_{200}$ of cured film (a-1-200) were 5.94 GPa and 6.20 GPa, respectively, and the value of $E_{10}/E_{200}$ was 0.958.

(3-2) Measurement of Reduced Modulus of Cured Film

The reduced moduli of the resulting cured films (a-1-10) and (a-1-200) were measured after 24 hours from the light exposure with a nanoindenter device (TI-950 TriboIndenter, manufactured by Hysitron, Inc.). The reduced modulus was determined as an average by measuring reduced moduli by an Oliver-Pharr method, quasi-static testing, by pushing a penetrator at a depth of 200 nm from the surface of the cured film at a certain point and repeating the measurement at 15 points and calculating the average of the measured moduli.

The reduced modulus $Er_{10}$ of cured film (a-1-10) and the reduced modulus $Er_{200}$ of cured film (a-1-200) were 3.27 GPa and 3.51 GPa, respectively, and the value of $Er_{10}/Er_{200}$ was 0.932.

(4) Observation of Nanoimprint Patterns

Subsequently, nanoimprint patterns of the curable composition for photoimprint (a-1) were formed by the method shown below, and a 6.75 μm square region of the nanoimprint patterns was observed with an electron microscope.

(4-1) Arrangement Step

Droplets (11 pL per droplet, 1440 droplets in total) of curable composition for photoimprint (a-1) were dropwise applied onto a 300-mm silicon wafer provided with an adhesion-accelerating layer having a thickness of 3 nm as an adhesion layer by ink jetting. Each droplet was dropwise applied to a region measuring 26 mm in length and 33 mm in width such that the intervals of each droplet are approximately equal.

(4-2) Mold Contact Step and Light Irradiation Step

Subsequently, a quartz mold (length: 26 mm, width: 33 mm) provided with 28 nm line and space (L/S) patterns but not applied with surface treatment was brought into contact with the curable composition for photoimprint (a-1) on the silicon wafer.

Subsequently, the curable composition was irradiated with UV light through the quartz mold after 30 seconds from the contact of the quartz mold using a UV light source (EXECURE 3000, manufactured by HOYA CANDEO OPTRONICS Corporation) equipped with a 200-W mercury-xenon lamp. In irradiation of UV light, an interference filter (VPF-50C-10-25-31300, manufactured by Sigma Koki Co., Ltd.) selectively permeating light of a wavelength of 313±5 nm was disposed between the UV light source and the quartz mold. The illumination of the UV light directly under the quartz mold was 40 mW/cm² at a wavelength of 313 nm. Irradiation of UV light was performed under the above-described conditions for 0.75 seconds (light exposure amount: 30 mJ/cm²).

(4-3) Mold-Releasing Step

Subsequently, the quartz mold was pulled up at a speed of 0.5 mm/sec to detach the mold from the photocured film.

(4-4) Observation of Nanoimprint Patterns with Electron Microscope

Observation of the nanoimprint patterns with an electron microscope demonstrated that satisfactory patterns having no defect such as the pattern collapse were formed.

The pattern collapses refers to a state that 28 nm line and space (L/S) patterns observed from directly above are not straight and are partially curved.

The curable composition for photoimprint (a-1) can form a satisfactory pattern at a light exposure amount of 30 mJ/cm². It can therefore be expected that the thermal distortion remaining in the subsequent shot is 1 nm or less and that a high alignment precision can be achieved.

Example 2

(1) Preparation of Curable Composition for Photoimprint (a-2)

A curable composition for photoimprint (a-2) was prepared as in Example 1 except that the compound represented by the following Formula (b) was used as component (B).

<B-2> Irgacure OXE01 (manufactured by BASF): 3 parts by weight

[Chem. 16]

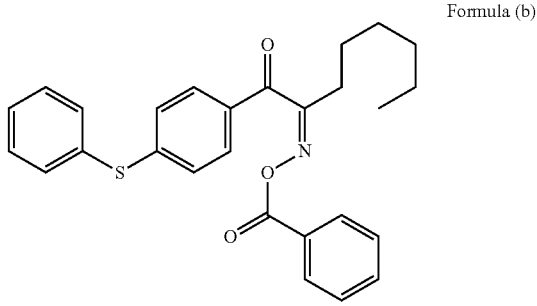

Formula (b)

(2) Production of Cured Film of Curable Composition for Photoimprint

As in Example 1, cured films (a-2-10) and (a-2-200) were each produced on silicon wafers by exposing films each having a thickness of 3.2 μm of the curable composition for photoimprint (a-2) to light of 10 mJ/cm² and light of 200 mJ/cm², respectively.

(3-1) Measurement of Young's Modulus of Cured Film

As in Example 1, the Young's moduli of the resulting cured films (a-2-10) and (a-2-200) were measured. The Young's modulus $E_{10}$ of the cured film (a-2-10) and the Young's modulus $E_{200}$ of the cured film (a-2-200) were 5.56 GPa and 6.18 GPa, respectively, and the value of $E_{10}/E_{200}$ was 0.900.

(3-2) Measurement of Reduced Modulus of Cured Film

As in Example 1, the reduced moduli of the resulting cured films (a-2-10) and (a-2-200) were measured. The reduced modulus $Er_{10}$ of the cured film (a-2-10) and the reduced modulus $Er_{200}$ of the cured film (a-2-200) were 3.01 GPa and 3.52 GPa, respectively, and the value of $Er_{10}/Er_{200}$ was 0.855.

(4) Observation of Nanoimprint Patterns

As in Example 1, nanoimprint patterns of the curable composition for photoimprint (a-2) were formed and were observed with an electron microscope. The observation demonstrated that satisfactory patterns having no defect such as the pattern collapse were formed.

The curable composition for photoimprint (a-2) can form a satisfactory pattern at a light exposure amount of 30 mJ/cm². It can therefore be expected that the thermal distortion remaining in the subsequent shot is 1 nm or less and that a high alignment precision can be achieved.

Comparative Example 1

(1) Preparation of Curable Composition for Photoimprint (b-1)

A curable composition for photoimprint (b-1) was prepared as in Example 1 except that the compounds represented by the following Formula (c) and (d) were used as component (B).

<B-3> Lucirin TPO (manufactured by BASF): 4 parts by weight

<B-4> Darocur 1173 (manufactured by BASF): 4 parts by weight

[Chem. 17]

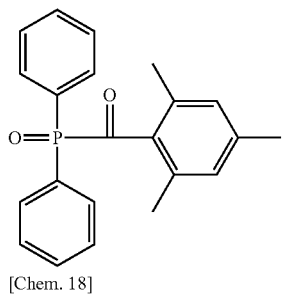

Formula (c)

[Chem. 18]

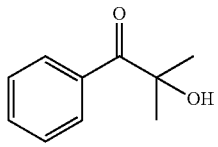

Formula (d)

(2) Production of Cured Film of Curable Composition for Photoimprint

As in Example 1, cured films (b-1-10) and (b-1-200) were produced on silicon wafers by exposing films each having a thickness of 3.2 μm of the curable composition for photoimprint (b-1) to light of 10 mJ/cm² and light of 200 mJ/cm², respectively.

(3-1) Measurement of Young's Modulus of Cured Film

As in Example 1, the Young's moduli of the resulting cured films (b-1-10) and (b-1-200) were measured. The Young's modulus $E_{10}$ of the cured film (b-1-10) and the Young's modulus $E_{200}$ of the cured film (b-1-200) were 4.87 GPa and 5.73 GPa, respectively, and the value of $E_{10}/E_{200}$ was 0.850.

(3-2) Measurement of Reduced Modulus of Cured Film

As in Example 1, the reduced moduli of the resulting cured films (b-1-10) and (b-1-200) were measured. The reduced modulus $Er_{10}$ of the cured film (b-1-10) and the reduced modulus $Er_{200}$ of the cured film (b-1-200) were 2.50 GPa and 3.18 GPa, respectively, and the value of $Er_{10}/Er_{200}$ was 0.786.

(4) Observation of Nanoimprint Patterns

As in Example 1, nanoimprint patterns of the curable composition for photoimprint (b-1) were formed and were observed with an electron microscope. A defect such as the pattern collapse was observed in about 50% of the patterns.

The minimum light exposure amount of the curable composition for photoimprint (b-1) necessary for forming satisfactory patterns not having a defect such as the pattern collapse was investigated, and a light exposure amount of at least 75 mJ/cm² was necessary. It was supposed that such a light exposure amount remains a thermal distortion of 2.9 nm or more in the subsequent shot and that the alignment precision is lower than those in Examples 1 to 12.

Example 3

(1) Preparation of Curable Composition for Photoimprint (a-3)

A curable composition for photoimprint (a-3) was prepared as in Example 1 except that the compound represented by the following Formula (e) was used as component (B).

<B-5> Irgacure 819 (manufactured by BASF): 3 parts by weight

[Chem. 19]

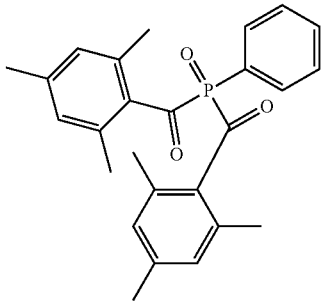

Formula (e)

(2) Production of Cured Film of Curable Composition for Photoimprint

As in Example 1, cured films (a-3-10) and (a-3-200) were produced on silicon wafers by exposing films each having a thickness of 3.2 μm of the curable composition for photoimprint (a-3) to light of 10 mJ/cm² and light of 200 mJ/cm², respectively.

(3-1) Measurement of Young's Modulus of Cured Film

The Young's moduli of the resulting cured films were not measured.

(3-2) Measurement of Reduced Modulus of Cured Film

As in Example 1, the reduced moduli of the resulting cured films (a-3-10) and (a-3-200) were measured. The reduced modulus $Er_{10}$ of the cured film (a-3-10) and the reduced modulus $Er_{200}$ of the cured film (a-3-200) were 3.14 GPa and 3.49 GPa, respectively, and the value of $Er_{10}/Er_{200}$ was 0.900.

(4) Observation of Nanoimprint Patterns

It was supposed from the resulting reduced moduli that nanoimprint patterns of the curable composition for photoimprint (a-3) formed as in Example 1 can be satisfactory without causing a defect such as the pattern collapse.

The curable composition for photoimprint (a-3) can form a satisfactory pattern at a light exposure amount of 30 mJ/cm². It can therefore be expected that the thermal distortion remaining in the subsequent shot is 1 nm or less and that a high alignment precision can be achieved.

Example 4

(1) Preparation of Curable Composition for Photoimprint (a-4)

A curable composition for photoimprint (a-4) was prepared as in Example 1 expect that the compound represented by the following Formula (c) was used as component (B).

<B-3> Lucirin TPO (manufactured by BASF): 3 parts by weight

[Chem. 20]

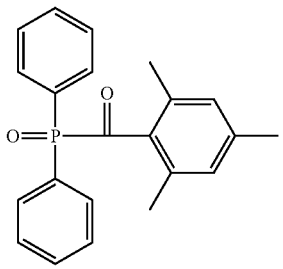

Formula (c)

(2) Production of Cured Film of Curable Composition for Photoimprint

As in Example 1, cured films (a-4-10) and (a-4-200) were produced on silicon wafers by exposing films each having a thickness of 3.2 μm of the curable composition for photoimprint (a-4) to light of 10 mJ/cm² and light of 200 mJ/cm², respectively.

(3-1) Measurement of Young's Modulus of Cured Film

The Young's moduli of the resulting cured films were not measured.

(3-2) Measurement of Reduced Modulus of Cured Film

As in Example 1, the reduced moduli of the resulting cured films (a-4-10) and (a-4-200) were measured. The reduced modulus $Er_{10}$ of the cured film (a-4-10) and the reduced modulus $Er_{200}$ of the cured film (a-4-200) were 3.22 GPa and 3.64 GPa, respectively, and the value of $Er_{10}/Er_{200}$ was 0.885.

(4) Observation of Nanoimprint Patterns

It was supposed from the resulting reduced moduli that nanoimprint patterns of the curable composition for photoimprint (a-4) formed as in Example 1 can be satisfactory without causing a defect such as the pattern collapse.

The curable composition for photoimprint (a-4) can form a satisfactory pattern at a light exposure amount of 30 mJ/cm². It can therefore be expected that the thermal distortion remaining in the subsequent shot is 1 nm or less and that a high alignment precision can be achieved.

Example 5

(1) Preparation of Curable Composition for Photoimprint (a-5)

A curable composition for photoimprint (a-5) was prepared as in Example 1 expect that the compound represented by the following Formula (c) was used as component (B) and that compound represented by the following Formula (f) was used as an optional component (C) other than component (A) and component (B).

<B-3> Lucirin TPO (manufactured by BASF): 3 parts by weight

<C-1> 4,4'-bis(diethylamino)benzophenone (manufactured by Tokyo Chemical Industry Co., Ltd.): 0.5 parts by weight

[Chem. 21]

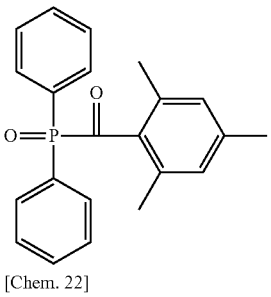

Formula (c)

[Chem. 22]

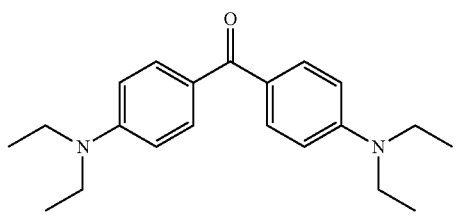

Formula (f)

(2) Production of Cured Film of Curable Composition for Photoimprint

As in Example 1, cured films (a-5-10) and (a-5-200) were produced on silicon wafers by exposing films each having a thickness of 3.2 μm of the curable composition for photoimprint (a-5) to light of 10 mJ/cm² and light of 200 mJ/cm², respectively.

(3-1) Measurement of Young's Modulus of Cured Film

As in Example 1, the Young's moduli of the resulting cured films (a-5-10) and (a-5-200) were measured. The Young's modulus $E_{10}$ of the cured film (a-5-10) and the Young's modulus $E_{200}$ of the cured film (a-5-200) were 4.83 GPa and 5.05 GPa, respectively, and the value of $E_{10}/E_{200}$ was 0.956.

(3-2) Measurement of Reduced Modulus of Cured Film

As in Example 1, the reduced moduli of the resulting cured films (a-5-10) and (a-5-200) were measured. The reduced modulus $Er_{10}$ of the cured film (a-5-10) and the reduced modulus $Er_{200}$ of the cured film (a-5-200) were 3.13 GPa and 3.48 GPa, respectively, and the value of $Er_{10}/Er_{200}$ was 0.899.

(4) Observation of Nanoimprint Patterns

As in example 1, nanoimprint patterns of the curable composition for photoimprint (a-5) were formed and were observed with an electron microscope. The observation demonstrated that satisfactory patterns having no defect such as the pattern collapse were formed.

The curable composition for photoimprint (a-5) can form a satisfactory pattern at a light exposure amount of 30 mJ/cm². It can therefore be expected that the thermal distortion remaining in the subsequent shot is 1 nm or less and that a high alignment precision can be achieved.

Example 6

(1) Preparation of Curable Composition for Photoimprint (a-6)

Component (A), component (B), and optional component (C) shown below were mixed. The mixture was filtered through an ultra-high molecular weight polyethylene filter of a pore size of 0.2 μm to prepare a curable composition for photoimprint (a-6) of Example 6.

(1-1) Component (A): 100 Parts by Weight in Total

<A-1> Isobornyl acrylate (manufactured by Kyoeisha Chemical Co., Ltd., trade name: IB-XA): 75.0 parts by weight <A-4> 1,6-Hexanediol diacrylate (manufactured by Kyoeisha Chemical Co., Ltd., trade name: 1.6 HX-A): 25.0 parts by weight (1-2) Component (B): 3 Parts by Weight in Total <B-3> Lucirin TPO (manufactured by BASF): 3 parts by weight (1-3) Optional Component (C) Other than Component (A) and Component (B): 0.5 Parts by Weight in Total <C-1> 4,4'-Bis(diethylamino)benzophenone (manufactured by Tokyo Chemical Industry Co., Ltd.): 0.5 parts by weight (2) Production of Cured Film of Curable Composition for Photoimprint As in Example 1, cured films (a-6-10) and (a-6-200) were produced on silicon wafers by exposing films each having a thickness of 3.2 μm of the curable composition for photoimprint (a-6) to light of 10 mJ/cm² and light of 200 mJ/cm², respectively.

(3-1) Measurement of Young's Modulus of Cured Film

As in Example 1, the Young's moduli of the resulting cured films (a-6-10) and (a-6-200) were measured. The Young's modulus $E_{10}$ of the cured film (a-6-10) and the Young's modulus $E_{200}$ of the cured film (a-6-200) were 4.33 GPa and 4.13 GPa, respectively, and the value of $E_{10}/E_{200}$ was 1.05.

(3-2) Measurement of Reduced Modulus of Cured Film

As in Example 1, the reduced moduli of the resulting cured films (a-6-10) and (a-6-200) were measured. The reduced modulus $Er_{10}$ of the cured film (a-6-10) and the reduced modulus $Er_{200}$ of the cured film (a-6-200) were 2.94 GPa and 2.96 GPa, respectively, and the value of $Er_{10}/Er_{200}$ was 0.993.

(4) Observation of Nanoimprint Patterns

As in example 1, nanoimprint patterns of the curable composition for photoimprint (a-6) were formed and were observed with an electron microscope. The observation demonstrated that satisfactory patterns having no defect such as the pattern collapse were formed.

The curable composition for photoimprint (a-6) can form a satisfactory pattern at a light exposure amount of 30 mJ/cm². It can therefore be expected that the thermal distortion remaining in the subsequent shot is 1 nm or less and that a high alignment precision can be achieved.

Example 7

(1) Preparation of Curable Composition for Photoimprint (a-7)

A curable composition for photoimprint (a-7) was prepared as in Example 6 except that the compounds represented by the following Formula (f) and (g) were used as optional component (C) other than component (A) and component (B).

<C-1> 4,4'-bis(diethylamino)benzophenone (manufactured by Tokyo Chemical Industry Co., Ltd.): 0.5 parts by weight <C-2> polyoxyethylene stearyl ether SR-705 (manufactured by Aoki Oil Industrial Co., Ltd.): 0.5 parts by weight

[Chem. 23]

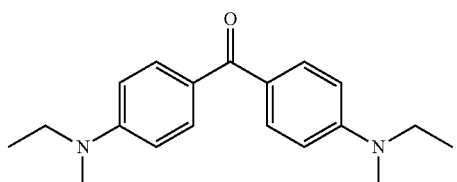

Formula (f)

[Chem. 24]

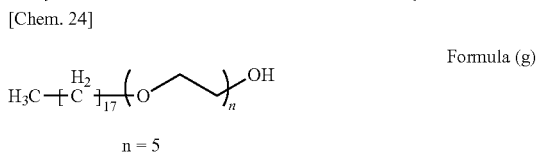

Formula (g)

n = 5

(2) Production of Cured Film of Curable Composition for Photoimprint

As in Example 1, cured films (a-7-10) and (a-7-200) were produced on silicon wafers by exposing films each having a thickness of 3.2 μm of the curable composition for photoimprint (a-7) to light of 10 mJ/cm² and light of 200 mJ/cm², respectively.

(3-1) Measurement of Young's Modulus of Cured Film

As in Example 1, the Young's moduli of the resulting cured films (a-7-10) and (a-7-200) were measured. The Young's modulus $E_{10}$ of the cured film (a-7-10) and the Young's modulus $E_{200}$ of the cured film (a-7-200) were 4.17 GPa and 4.27 GPa, respectively, and the value of $E_{10}/E_{200}$ was 0.977.

(3-2) Measurement of Reduced Modulus of Cured Film

As in Example 1, the reduced moduli of the resulting cured films (a-7-10) and (a-7-200) were measured. The reduced modulus $Er_{10}$ of the cured film (a-7-10) and the reduced modulus $Er_{200}$ of the cured film (a-7-200) were 2.81 GPa and 3.11 GPa, respectively, and the value of $Er_{10}/Er_{200}$ was 0.904.

(4) Observation of Nanoimprint Patterns

As in example 1, nanoimprint patterns of the curable composition for photoimprint (a-7) were formed and were observed with an electron microscope. The observation demonstrated that satisfactory patterns having no defect such as the pattern collapse were formed.

The curable composition for photoimprint (a-7) can form a satisfactory pattern at a light exposure amount of 30 mJ/cm². It can therefore be expected that the thermal distortion remaining in the subsequent shot is 1 nm or less and that a high alignment precision can be achieved.

Comparative Example 2

(1) Preparation of Curable Composition for Photoimprint (b-2)

A curable composition for photoimprint (b-2) was prepared as in Example 1 except that the compound represented by the following Formula (h) was used as component (B).

<B-6> Irgacure 651 (manufactured by BASF): 3 parts by weight

[Chem. 25]

Formula (h)

(2) Production of Cured Film of Curable Composition for Photoimprint

As in Example 1, a cured film (b-2-200) was produced on a silicon wafer by exposing a film having a thickness of 3.2 µm of the curable composition for photoimprint (b-2) to light of 200 mJ/cm². A film having a thickness of 3.2 µm of the curable composition for photoimprint (b-2) exposed to light of 10 mJ/cm² was formed into an insufficiently cured film (b-2-10).

(3-1) Measurement of Young's Modulus of Cured Film

As in Example 1, the Young's modulus of the resulting cured film (b-2-200) was measured. The Young's modulus $E_{200}$ of the cured film (b-2-200) was 4.60 GPa. The Young's modulus $E_{10}$ of the insufficiently cured film (b-2-10) was approximately zero, and the value of $E_{10}/E_{200}$ was judged to be approximately zero.

(3-2) Measurement of Reduced Modulus of Cured Film

As in Example 1, the reduced modulus of the resulting cured film (b-2-200) was measured. The reduced modulus $Er_{200}$ of the cured film (b-2-200) was 3.11 GPa. The reduced modulus $Er_{10}$ of the insufficiently cured film (b-2-10) was approximately zero, and the value of $Er_{10}/Er_{200}$ was judged to be approximately zero.

(4) Observation of Nanoimprint Patterns

As in Example 1, nanoimprint patterns of the curable composition for photoimprint (b-2) were formed and were observed with an electron microscope. A defect such as the pattern collapse was observed in about 90% of the patterns.

The minimum light exposure amount of the curable composition for photoimprint (b-2) necessary for forming satisfactory patterns not having a defect such as the pattern collapse was investigated, and a light exposure amount of at least 75 mJ/cm² was necessary. It was supposed that such a light exposure amount remains a thermal distortion of 2.9 nm or more in the subsequent shot and that the alignment precision is lower than those in Examples 1 to 12.

Comparative Example 3

(1) Preparation of Curable Composition for Photoimprint (b-3)

A curable composition for photoimprint (b-3) was prepared as in Comparative Example 2 except that the compounds shown below were used as component (A).

<A-1> Isobornyl acrylate (manufactured by Kyoeisha Chemical Co., Ltd., trade name: IB-XA): 75.0 parts by weight <A-4> 1,6-Hexanediol diacrylate (manufactured by Kyoeisha Chemical Co., Ltd., trade name: 1.6 HX-A): 25.0 parts by weight (2) Production of Cured Film of Curable Composition for Photoimprint As in Example 1, a cured film (b-3-200) was produced on a silicon wafer by exposing a film having a thickness of 3.2 µm of the curable composition for photoimprint (b-3) to light of 200 mJ/cm². A film having a thickness of 3.2 µm of the curable composition for photoimprint (b-3) exposed to light of 10 mJ/cm² was formed into an insufficiently cured film (b-3-10).

(3-1) Measurement of Young's Modulus of Cured Film

The Young's moduli of the resulting cured films were not measured.

(3-2) Measurement of Reduced Modulus of Cured Film

As in Example 1, the reduced modulus of the resulting cured film (b-3-200) was measured. The reduced modulus $Er_{200}$ of the cured film (b-3-200) was 3.11 GPa. The reduced modulus $Er_{10}$ of the insufficiently cured film (b-3-10) was approximately zero, and the value of $Er_{10}/Er_{200}$ was judged to be approximately zero.

(4) Observation of Nanoimprint Patterns

It was supposed from the resulting reduced moduli that a defect such as the pattern collapse occurs in many nanoimprint patterns of the curable composition for photoimprint (b-3) formed as in Example 1.

It was believed that the minimum light exposure amount of the curable composition for photoimprint (b-3) necessary for forming satisfactory patterns not having a defect such as the pattern collapse is large. It was supposed that such a light exposure amount remains a thermal distortion of 2.9 nm or more in the subsequent shot and that the alignment precision is lower than those in Examples 1 to 12.

Example 8

(1) Preparation of Curable Composition for Photoimprint (a-8)

Component (A), component (B), and optional component (C) shown below were mixed. The mixture was filtered through an ultra-high molecular weight polyethylene filter of a pore size of 0.2 µm to prepare a curable composition for photoimprint (a-8) of Example 8.

(1-1) Component (A): 100 Parts by Weight in Total

<A-2> Benzyl acrylate (manufactured by Osaka Organic Chemical Industry Ltd., trade name: V#160): 50 parts by weight <A-5> Dimethylol tricyclodecane diacrylate (manufactured by Kyoeisha Chemical Co., Ltd., trade name: DCP-A): 50 parts by weight (1-2) Component (B): 3 Parts by Weight in Total <B-3> Lucirin TPO (manufactured by BASF): 3 parts by weight (1-3) Optional Component (C) Other than Component (A) and Component (B): 2.1 Parts by Weight in Total <C-1> 4,4'-Bis(diethylamino)benzophenone (manufactured by Tokyo Chemical Industry Co., Ltd.): 0.5 parts by weight <C-3> Polyoxyethylene stearyl ether SR-730 (manufactured by Aoki Oil Industrial Co., Ltd.): 1.6 parts by weight

[Chem. 26]

Formula (j)

(2) Production of Cured Film of Curable Composition for Photoimprint

As in Example 1, cured films (a-8-10) and (a-8-200) were produced on silicon wafers by exposing films each having a thickness of 3.2 μm of the curable composition for photoimprint (a-8) to light of 10 mJ/cm² and light of 200 mJ/cm², respectively.

(3-1) Measurement of Young's Modulus of Cured Film

The Young's moduli of the resulting cured films were not measured.

(3-2) Measurement of Reduced Modulus of Cured Film

As in Example 1, the reduced moduli of the resulting cured films (a-8-10) and (a-8-200) were measured. The reduced modulus $Er_{10}$ of the cured film (a-8-10) and the reduced modulus $Er_{200}$ of the cured film (a-8-200) were 3.51 GPa and 3.99 GPa, respectively, and the value of $Er_{10}/Er_{200}$ was 0.880.

(4) Observation of Nanoimprint Patterns

It was supposed from the resulting reduced moduli that nanoimprint patterns of the curable composition for photoimprint (a-8) formed as in Example 1 can be satisfactory without causing a defect such as the pattern collapse.

It is believed that the curable composition for photoimprint (a-8) can form a satisfactory pattern at a light exposure amount of 30 mJ/cm². It can therefore be expected that the thermal distortion remaining in the subsequent shot is 1 nm or less and that a high alignment precision can be achieved.

Example 9

(1) Preparation of Curable Composition for Photoimprint (a-9)

A curable composition for photoimprint (a-9) was prepared as in Example 8 except that the following compounds were used as component (A) at the ratio shown below.

(1-1) Component (A): 100 Parts by Weight in Total

<A-2> Benzyl acrylate (manufactured by Osaka Organic Chemical Industry Ltd., trade name: V#160): 60 parts by weight <A-5> Dimethylol tricyclodecane diacrylate (manufactured by Kyoeisha Chemical Co., Ltd., trade name: DCP-A): 40 parts by weight (2) Production of Cured Film of Curable Composition for Photoimprint As in Example 1, cured films (a-9-10) and (a-9-200) were produced on silicon wafers by exposing films each having a thickness of 3.2 μm of the curable composition for photoimprint (a-9) to light of 10 mJ/cm² and light of 200 mJ/cm², respectively.

(3-1) Measurement of Young's Modulus of Cured Film

The Young's moduli of the resulting cured films were not measured.

(3-2) Measurement of Reduced Modulus of Cured Film

As in Example 1, the reduced moduli of the resulting cured films (a-9-10) and (a-9-200) were measured. The reduced modulus $Er_{10}$ of the cured film (a-9-10) and the reduced modulus $Er_{200}$ of the cured film (a-9-200) were 3.49 GPa and 3.82 GPa, respectively, and the value of $Er_{10}/Er_{200}$ was 0.914.

(4) Observation of Nanoimprint Patterns

It was supposed from the resulting reduced moduli that nanoimprint patterns of the curable composition for photoimprint (a-9) formed as in Example 1 can be satisfactory without causing a defect such as the pattern collapse.

It is believed that the curable composition for photoimprint (a-9) can form a satisfactory pattern at a light exposure amount of 30 mJ/cm². It can therefore be expected that the thermal distortion remaining in the subsequent shot is 1 nm or less and that a high alignment precision can be achieved.

Example 10

(1) Preparation of Curable Composition for Photoimprint (a-10)

Component (A), component (B), and optional component (C) shown below were mixed. The mixture was filtered through an ultra-high molecular weight polyethylene filter of a pore size of 0.2 μm to prepare a curable composition for photoimprint (a-10) of Example 10.

(1-1) Component (A): 100 Parts by Weight in Total

<A-2> Benzyl acrylate (manufactured by Osaka Organic Chemical Industry Ltd., trade name: V#160): 50 parts by weight <A-6> Phenylethylene glycol diacrylate: 50 parts by weight

[Chem. 27]

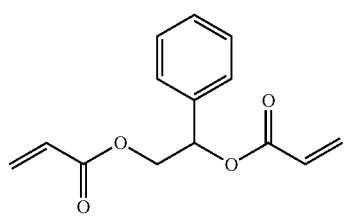

Formula (k)

(1-2) Component (B): 3 Parts by Weight in Total

<B-3> Lucirin TPO (manufactured by BASF): 3 parts by weight (1-3) Optional Component (C) Other than Component (A) and Component (B): 1.3 Parts by Weight in Total <C-1> 4,4'-Bis(diethylamino)benzophenone (manufactured by Tokyo Chemical Industry Co., Ltd.): 0.5 parts by weight <C-3> Polyoxyethylene stearyl ether Emalgen 320P (manufactured by Kao Corp.): 0.8 parts by weight

[Chem. 28]

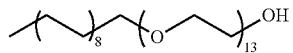

Formula (l)

(2) Production of Cured Film of Curable Composition for Photoimprint

As in Example 1, cured films (a-10-10) and (a-10-200) were produced on silicon wafers by exposing films each having a thickness of 3.2 μm of the curable composition for photoimprint (a-10) to light of 10 mJ/cm² and light of 200 mJ/cm², respectively.

(3-1) Measurement of Young's Modulus of Cured Film

The Young's moduli of the resulting cured films were not measured.

(3-2) Measurement of Reduced Modulus of Cured Film

As in Example 1, the reduced moduli of the resulting cured films (a-10-10) and (a-10-200) were measured. The reduced modulus $Er_{10}$ of the cured film (a-10-10) and the reduced modulus $Er_{200}$ of the cured film (a-10-200) were 3.25 GPa and 3.76 GPa, respectively, and the value of $Er_{10}/Er_{200}$ was 0.864.

(4) Observation of Nanoimprint Patterns

It was supposed from the resulting reduced moduli that nanoimprint patterns of the curable composition for photoimprint (a-10) formed as in Example 1 can be satisfactory without causing a defect such as the pattern collapse.

It is believed that the curable composition for photoimprint (a-10) can form a satisfactory pattern at a light exposure amount of 30 mJ/cm$^2$. It can therefore be expected that the thermal distortion remaining in the subsequent shot is 1 nm or less and that a high alignment precision can be achieved.

Example 11

(1) Preparation of Curable Composition for Photoimprint (a-11)

A curable composition for photoimprint (a-11) was prepared as in Example 10 except that the compounds shown below were used as component (A).

<A-2> Benzyl acrylate (manufactured by Osaka Organic Chemical Industry Ltd., trade name: V#160): 50 parts by weight <A-7> m-Xylene diacrylate: 50 parts by weight

[Chem. 29]

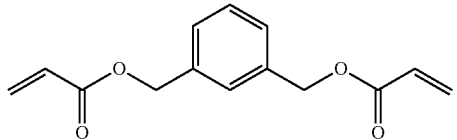

Formula (m)

(2) Production of Cured Film of Curable Composition for Photoimprint

As in Example 1, cured films (a-11-10) and (a-11-200) were produced on silicon wafers by exposing films each having a thickness of 3.2 pat of the curable composition for photoimprint (a-11) to light of 10 mJ/cm$^2$ and light of 200 mJ/cm$^2$, respectively.

(3-1) Measurement of Young's Modulus of Cured Film

The Young's moduli of the resulting cured films were not measured.

(3-2) Measurement of Reduced Modulus of Cured Film

As in Example 1, the reduced moduli of the resulting cured films (a-11-10) and (a-11-200) were measured. The reduced modulus $Er_{10}$ of the cured film (a-11-10) and the reduced modulus $Er_{200}$ of the cured film (a-11-200) were 3.73 GPa and 4.04 GPa, respectively, and the value of $Er_{10}/Er_{200}$ was 0.923.

(4) Observation of Nanoimprint Patterns

It was supposed from the resulting reduced moduli that nanoimprint patterns of the curable composition for photoimprint (a-11) formed as in Example 1 can be satisfactory without causing a defect such as the pattern collapse.

It is believed that the curable composition for photoimprint (a-11) can form a satisfactory pattern at a light exposure amount of 30 mJ/cm$^2$. It can therefore be expected that the thermal distortion remaining in the subsequent shot is 1 nm or less and that a high alignment precision can be achieved.

Example 12

(1) Preparation of Curable Composition for Photoimprint (a-12)

A curable composition for photoimprint (a-12) was prepared as in Example 10 except that compounds shown below were used as component (A).

<A-2> Benzyl acrylate (manufactured by Osaka Organic Chemical Industry Ltd., trade name: V#160): 45 parts by weight <A-7> m-Xylene diacrylate: 50 parts by weight

[Chem. 30]

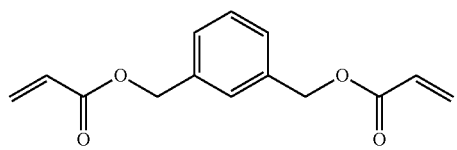

Formula (m)

<A-8> 2-Naphthylmethyl acrylate: 5 parts by weight

[Chem. 31]

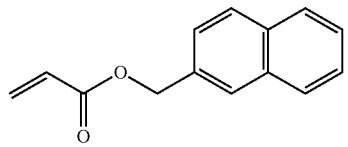

Formula (n)

(2) Production of Cured Film of Curable Composition for Photoimprint

As in Example 1, cured films (a-12-10) and (a-12-200) were produced on silicon wafers by exposing films each having a thickness of 3.2 μm of the curable composition for photoimprint (a-12) to light of 10 mJ/cm$^2$ and light of 200 mJ/cm$^2$, respectively.

(3-1) Measurement of Young's Modulus of Cured Film

The Young's moduli of the resulting cured films were not measured.

(3-2) Measurement of Reduced Modulus of Cured Film

As in Example 1, the reduced moduli of the resulting cured films (a-12-10) and (a-12-200) were measured. The reduced modulus $Er_{10}$ of the cured film (a-12-10) and the reduced modulus $Er_{200}$ of the cured film (a-12-200) were 3.53 GPa and 4.00 GPa, respectively, and the value of $Er_{10}/Er_{200}$ was 0.883.

(4) Observation of Nanoimprint Patterns

It was supposed from the resulting reduced moduli that nanoimprint patterns of the curable composition for photoimprint (a-12) formed as in Example 1 can be satisfactory without causing a defect such as the pattern collapse.

It is believed that the curable composition for photoimprint (a-12) can form a satisfactory pattern at a light exposure amount of 30 mJ/cm$^2$. It can therefore be expected that the thermal distortion remaining in the subsequent shot is 1 nm or less and that a high alignment precision can be achieved.

Comparative Example 4

(1) Preparation of Curable Composition for Photoimprint (b-4)

A curable composition for photoimprint (b-4) was prepared as in Example 1 except that the compound shown below was used as component (B).

<B-3> Lucirin TPO (manufactured by BASF): 0.5 parts by weight (2) Production of Cured Film of Curable Composition for Photoimprint As in Example 1, a cured film (b-4-200) was produced on a silicon wafer by exposing a film having a thickness of 3.2 μm of the curable composition for photoimprint (b-4) to light of 200 mJ/cm². A film having a thickness of 3.2 μm of the curable composition for photoimprint (b-4) exposed to light of 10 mJ/cm² was formed into an insufficiently cured film (b-4-10).

(3-1) Measurement of Young's Modulus of Cured Film

The Young's moduli of the resulting cured films were not measured.

(3-2) Measurement of Reduced Modulus of Cured Film

As in Example 1, the reduced modulus of the resulting cured film (b-4-200) was measured. The reduced modulus $Er_{200}$ of the cured film (b-4-200) was 2.73 GPa. The reduced modulus $Er_{10}$ of the insufficiently cured film (b-4-10) was approximately zero, and the value of $Er_{10}/Er_{200}$ was judged to be approximately zero.

(4) Observation of Nanoimprint Patterns

It was supposed from the resulting reduced moduli that a defect such as the pattern collapse occurs in many nanoimprint patterns of the curable composition for photoimprint (b-4) formed as in Example 1.

It was believed that the minimum light exposure amount of the curable composition for photoimprint (b-4) necessary for forming satisfactory patterns not having a defect such as the pattern collapse is large. It was therefore supposed that such a light exposure amount remains a thermal distortion of 2.9 nm or more in the subsequent shot and that the alignment precision is lower than those in Examples 1 to 12.

The results of examples and comparative examples are summarized in Tables 1 to 3.

TABLE 1

| | curable composition for photoimprint | $E_{10}$ (GPa) | $E_{200}$ (GPa) | $E_{10}/E_{200}$ | Pattern | Alignment precision |
|---|---|---|---|---|---|---|
| Example 1 | a-1 | 5.94 | 6.20 | 0.958 | ○ | ○ |
| Example 2 | a-2 | 5.56 | 6.18 | 0.900 | ○ | ○ |
| Comparative Example 1 | b-1 | 4.87 | 5.73 | 0.850 | x | x |
| Example 5 | a-5 | 4.83 | 5.05 | 0.956 | ○ | ○ |
| Example 6 | a-6 | 4.33 | 4.13 | 1.048 | ○ | ○ |
| Example 7 | a-7 | 4.17 | 4.27 | 0.977 | ○ | ○ |
| Comparative Example 2 | b-2 | NA* | 4.60 | NA* | x | x |

(notes)
*It was judged to be approximately zero due to insufficient curing.
Pattern ○: Satisfactory patterns without having a defect such as the pattern collapse
Pattern x: Patterns having a defect such as the pattern collapse
Alignment precision ○: A thermal distortion remaining in the subsequent shot of 1 nm or less
Alignment precision x: A thermal distortion remaining in the subsequent shot of 2.9 nm or more

TABLE 2

| | curable composition for photoimprint | $Er_{10}$ (GPa) | $Er_{200}$ (GPa) | $Er_{10}/Er_{200}$ | Pattern | Alignment precision |
|---|---|---|---|---|---|---|
| Example 1 | a-1 | 3.27 | 3.51 | 0.932 | ○ | ○ |
| Example 2 | a-2 | 3.01 | 3.52 | 0.855 | ○ | ○ |
| Comparative Example 1 | b-1 | 2.50 | 3.18 | 0.786 | x | x |
| Example 5 | a-5 | 3.13 | 3.48 | 0.899 | ○ | ○ |
| Example 6 | a-6 | 2.94 | 2.96 | 0.993 | ○ | ○ |
| Example 7 | a-7 | 2.81 | 3.11 | 0.904 | ○ | ○ |
| Comparative Example 2 | b-2 | NA* | 3.11 | NA* | x | x |

(notes)
*It was judged to be approximately zero due to insufficient curing.
Pattern ○: Satisfactory patterns without having a defect such as the pattern collapse
Pattern x: Patterns having a defect such as the pattern collapse
Alignment precision ○: A thermal distortion remaining in the subsequent shot of 1 nm or less
Alignment precision x: A thermal distortion remaining in the subsequent shot of 2.9 nm or more

TABLE 3

| | curable composition for photoimprint | $Er_{10}$ (GPa) | $Er_{200}$ (GPa) | $Er_{10}/Er_{200}$ |
|---|---|---|---|---|
| Example 3 | a-3 | 3.14 | 3.49 | 0.900 |
| Example 4 | a-4 | 3.22 | 3.64 | 0.885 |
| Example 8 | a-8 | 3.51 | 3.99 | 0.880 |
| Example 9 | a-9 | 3.49 | 3.82 | 0.914 |
| Example 10 | a-10 | 3.25 | 3.76 | 0.864 |
| Example 11 | a-11 | 3.73 | 4.04 | 0.923 |
| Example 12 | a-12 | 3.53 | 4.00 | 0.883 |
| Comparative Example 3 | b-3 | NA* | 3.11 | NA* |
| Comparative Example 4 | b-4 | NA* | 2.73 | NA* |

(notes)
*It was judged to be approximately zero due to insufficient curing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-179270 filed Aug. 30, 2013, No. 2014-035846 filed Feb. 26, 2014, and No. 2014-151500 filed Jul. 25, 2014, which are hereby incorporated by reference herein in their entirety.

The invention claimed is:

1. A curable composition for photoimprint comprising at least a polymerizable compound component (A) and a photopolymerization initiator component (B), and satisfying the following expression (1) and (2):

$$0.800 \leq Er_{10}/Er_{200} \quad (1)$$

$$2.55 \text{ GPa} \leq Er_{10} \quad (2)$$

where $Er_{10}$ represents reduced modulus (GPa) of a photocured film obtained by exposing a film of the curable composition for photoimprint to light of 10 mJ/cm²; and $Er_{200}$ represents reduced modulus (GPa) of a photocured film obtained by exposing a film of the curable composition for photoimprint to light of 200 mJ/cm², wherein the component (A) contains: monofunctional acrylate composed of at least any one of isobornyl acrylate, benzyl acrylate, and 2-naphtylmethyl acrylate; and multifunctional acrylate composed of at least any one of neopentyl glycol diacrylate, 1,6-hexanediol diacrylate, dimethylol tricyclodecane diacrylate, phenylethylene glycol diacrylate, and m-xylylene diacrylate, a weight ratio of a total amount of the monofunctional acrylate to a total amount of the multifunctional acrylate is 1:1 to 3:1, and the component (B) contains at least any one of an alkylphenone polymerization initiator, an oxime ester polymerization initiator, and an acylphosphine oxide polymerization initiator, the component (A) of the curable composition for photoimprint is 90% by weight or more, and the component (B) of the curable composition is 3×100/97 (that is about 3.0927%) by weight of more.

2. The curable composition for photoimprint according to claim 1, wherein the curable composition for photoimprint further satisfies expression (3):

$$0.885 \leq Er_{10}/Er_{200} \leq 0.993 \quad (3)$$

wherein, $Er_{10}$ represents the reduced modulus (GPa) of a photocured film prepared by exposing a film of the curable composition for photoimprint to light of 10 mJ/cm²; and $Er_{200}$ represents the reduced modulus (GPa) of a photocured film prepared by exposing a film of the curable composition for photoimprint to light of 200 mJ/cm².

3. The curable composition for photoimprint according to claim 1, wherein the curable composition for photoimprint further satisfies expression (4):

$$2.81 \text{ GPa} \leq Er_{10} \leq 3.73 \text{ GPa} \quad (4)$$

wherein, $Er_{10}$ represents the reduced modulus (GPa) of a photocured film prepared by exposing a film of the curable composition for photoimprint to light of 10 mJ/cm².

4. The curable composition for photoimprint according to claim 1, wherein the component (A) is composed of isobornyl acrylate, benzyl acrylate, and neopentyl glycol diacrylate or is composed of isobornyl acrylate and 1,6-hexanediol diacrylate.

5. The curable composition for photoimprint according to claim 4, wherein the component (A) is composed of isobornyl acrylate, benzyl acrylate, and neopentyl glycol diacrylate.

6. The curable composition for photoimprint according to claim 1, wherein the component (B) includes at least any one of compounds represented by the following Formula (a), (b), (c) and (e):

[Chem. 1]

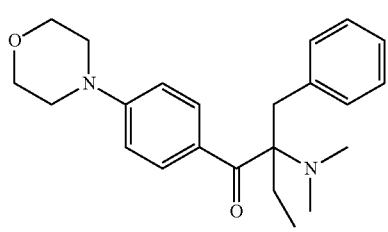

Formula (a)

[Chem. 2]

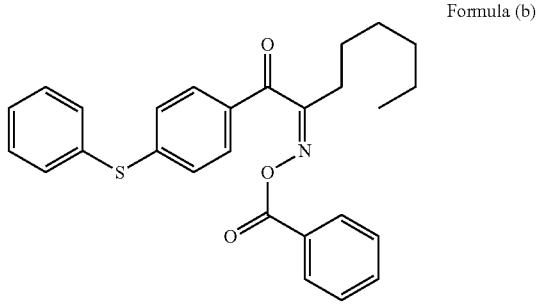

Formula (b)

[Chem. 3]

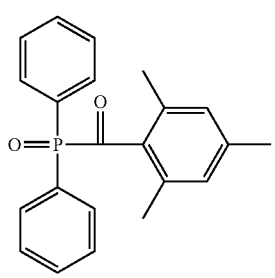

Formula (c)

[Chem. 4]

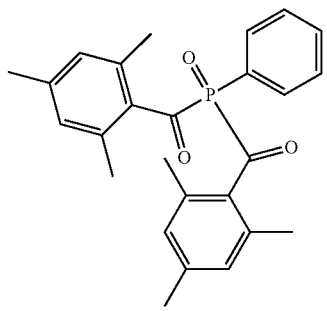

Formula (e)

7. The curable composition for photoimprint according to claim 1, further comprising a sensitizer.

8. The curable composition for photoimprint according to claim 7, wherein the sensitizer is a compound represented by the following Formula (f) or (i):

[Chem. 5]

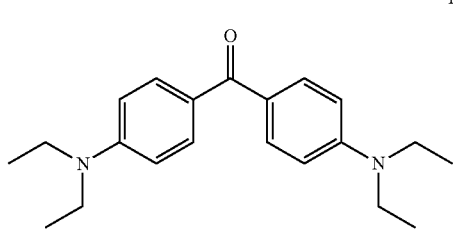

Formula (f)

[Chem. 6]

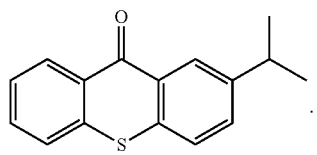

Formula (i)

9. A curable composition for photoimprint comprising at least a polymerizable compound component (A) a photopolymerization initiator component (B), a releasing agent, and satisfying the following expression (1) and (2):

$$0.800 \le Er_{10}/Er_{200} \quad (1)$$

$$2.55 \text{GPa} \le Er_{10} \quad (2)$$

where $Er_{10}$ represents reduced modulus (GPa) of a photocured film obtained by exposing a film of the curable composition for photoimprint to light of 10 mJ/cm$^2$; and Er200 represents reduced modulus (GPa) of a photocured film obtained by exposing a film of the curable composition for photoimprint to light of 200 mJ/cm$^2$, wherein the component (A) contains: monofunctional acrylate composed of at least any one of isobornyl acrylate, benzyl acrylate, and 2-naphtylmethyl acrylate; and multifunctional acrylate composed of at least any one of neopentyl glycol diacrylate, 1,6-hexanediol diacrylate, dimethylol tricyclodecane diacrylate, phenylethylene glycol diacrylate, and m-xylylene diacrylate, a weight ratio of a total amount of the monofunctional acrylate to a total amount of the multifunctional acrylate is 1:1 to 3:1, and the component (B) contains at least any one of an alkylphenone polymerization initiator, an oxime ester polymerization initiator, and an acylphosphine oxide polymerization initiator.

10. The curable composition for photoimprint according to claims 9, wherein the releasing agent is a compound represented by the following Formula (o):

[Chem. 7]

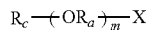

Formula (o)

In Formula (o), Rc represents a monovalent hydrocarbon group having 5 to 50 carbon atoms; Ra represents an alkylene group; m represents an integer of 1 to 10; and X represents an alkoxy group, a hydroxyl group, a carboxyl group, a pyridyl group, a silanol group, or a sulfo group.

11. The curable composition for photoimprint according to claim 10, wherein the releasing agent includes at least any one of compounds represented by the following Formula (g), (j) and (l):

[Chem. 8]

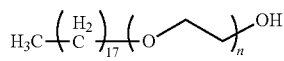

n = 5

Formula (g)

[Chem. 9]

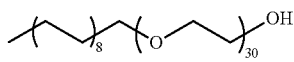

Formula (j)

[Chem. 10]

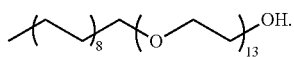

Formula (l)

12. A curable composition for photoimprint comprising:

a component (A) containing a monofunctional compound composed of isobornyl acrylate or isobornyl acrylate and benzyl acrylate and a multifunctional compound composed of neopentyl glycol diacrylate or 1,6-hexanediol diacrylate or dimethylol tricyclodecane diacrylate; and component (B) containing at least one of the compounds represented by Formulae (a), (b), (c), and (e), wherein the weight ratio of the monofunctional compound and the multifunctional compound is 1:1 to 3:1.

[Chem. 11]

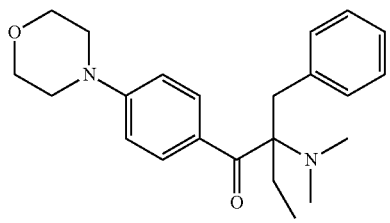

Formula (a)

[Chem. 12]

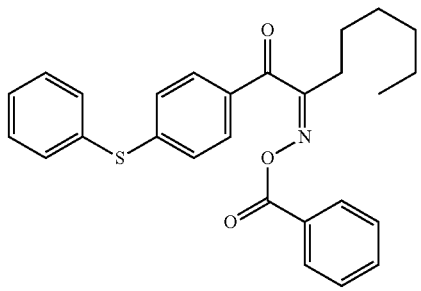

Formula (b)

[Chem. 13]

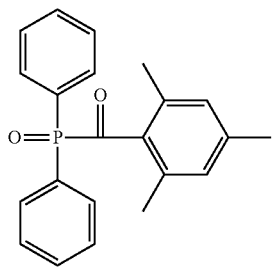

Formula (c)

-continued

[Chem. 14]

Formula (e)

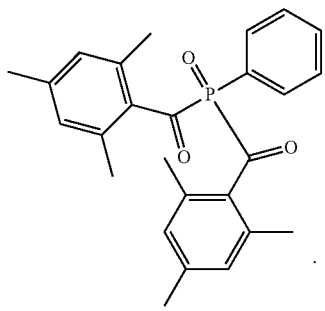

13. The curable composition for photoimprint according to claim 12, further comprising a compound represented by the following Formula (f):

[Chem. 15]

Formula (f)

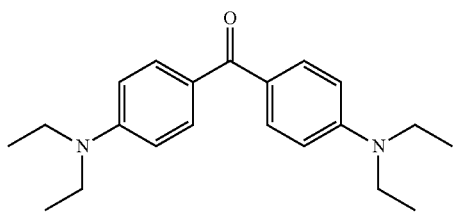

14. The curable composition for photoimprint according to claim 12, further comprising at least any one of compounds represented by the following Formula (g), (j) and (l):

[Chem. 16]

Formula (g)

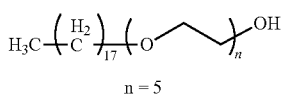

n = 5

[Chem. 17]

Formula (j)

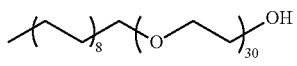

[Chem. 18]

Formula (l)

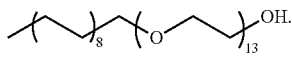

15. The curable composition for photoimprint according to claim 12, wherein the component (A) of the curable composition for photoimprint is 90% by weight or more.

16. The curable composition for photoimprint according to claim 1, wherein a photocured film prepared by exposing a film of the curable composition for photoimprint to light has a thickness of 100 nm or less.

17. A cured product prepared by curing the curable composition for photoimprint according to claim 1.

18. A method of producing a film having a pattern, the method comprising:

step [1] arranging a curable composition for photoimprint according to claim 1 on a substrate;
step [2] bringing the curable composition for photoimprint into contact with a mold having a mold pattern for transferring the pattern;
step [3] adjusting the positions of the substrate and the mold;
step [4] irradiating the curable composition for photoimprint with light to form a cured film; and
step [5] detaching the cured film from the mold.

19. The method of producing a film having a pattern according to claim 18, wherein the step [4] of irradiating the curable composition for photoimprint with light to form a cured film is performed at a light exposure amount of 75 mJ/cm$^2$ or less.

20. The method of producing a film having a pattern according to claim 18, wherein the step [4] of irradiating the curable composition for photoimprint with light to form a cured film is performed at a light exposure amount of 30 mJ/cm$^2$ or less.

21. The method of producing a film having a pattern according to claim 18, wherein the steps [1] to [5] are conducted for plural times at different regions on the substrate.

22. The method of producing a film having a pattern according to claim 21, wherein in steps [1] to [5] constituting one shot, the time from the completion of the step [4] in at shot to the completion of the step [3] in the subsequent shot is within 1.2 seconds.

23. The method of producing a film having a pattern according to claim 18, wherein the mold pattern of the mold has a surface made of quartz.

24. The method of producing a film having a pattern according to claim 15, wherein the mold contact step [2] is performed under an atmosphere containing a condensable gas.

25. The method of producing a film having a pattern according to claim 23, wherein the atmosphere containing a condensable gas is a gas mixture of helium and a condensable gas.

26. The method of producing a film having a pattern according to claim 24, wherein the condensable gas is 1,1,1,3,3-pentafluoropropane.

27. A method of producing an optical component, the method comprising:
producing a film having a pattern by a method of producing a film according to claim 18.

28. A method of producing an optical component, the method comprising:
producing a film having a pattern by a method of producing a film according to claim 18; and
subjecting the substrate to etching or ion implantation using the pattern of the resulting film as a mask.

29. A method of producing a circuit board, the method comprising:
producing a film having a pattern by a method of producing a film according to claim 18; and
subjecting the substrate to etching or ion implantation using the pattern of the resulting film as a mask.

30. A method of producing an electronic component, the method comprising:
producing a circuit board by the method of producing a circuit board according to claim 25; and
forming an electronic member on the circuit board.

* * * * *